(12) United States Patent
Rachet et al.

(10) Patent No.: US 9,075,227 B2
(45) Date of Patent: Jul. 7, 2015

(54) HIGH-RESOLUTION MICROSCOPY AND PHOTOLITHOGRAPHY DEVICES USING FOCUSING MICROMIRRORS

(75) Inventors: Bastien Rachet, Lausanne (CH);
Fabrice Merenda, Lausanne (CH);
René Salathe, Ecublens (CH)

(73) Assignee: ECOLE POLYTECHNIQUE FEDERALE DE LAUSANNE (EPFL), Lausanne (CH)

(*) Notice: Subject to any disclaimer, the term of this patent is extended or adjusted under 35 U.S.C. 154(b) by 45 days.

(21) Appl. No.: 13/145,916

(22) PCT Filed: Jan. 23, 2010

(86) PCT No.: PCT/IB2010/050300
§ 371 (c)(1),
(2), (4) Date: Aug. 15, 2011

(87) PCT Pub. No.: WO2010/084478
PCT Pub. Date: Jul. 29, 2010

(65) Prior Publication Data
US 2011/0300490 A1    Dec. 8, 2011

(30) Foreign Application Priority Data

Jan. 24, 2009    (WO) ............... PCT/IB2009/050285

(51) Int. Cl.
*G02B 21/00* (2006.01)
(52) U.S. Cl.
CPC .......... *G02B 21/004* (2013.01); *G02B 21/0032* (2013.01); *G02B 21/0076* (2013.01)

(58) Field of Classification Search
CPC .................. G02B 21/0024–21/0076
USPC .................... 359/368–384; 355/53
See application file for complete search history.

(56) References Cited

U.S. PATENT DOCUMENTS

| | | | |
|---|---|---|---|
| 6,133,986 A | 10/2000 | Johnson | |
| 6,392,752 B1* | 5/2002 | Johnson | 356/511 |
| 7,706,043 B2* | 4/2010 | Uhl et al. | 359/235 |
| 2003/0147083 A1* | 8/2003 | Hill | 356/491 |
| 2005/0018199 A1* | 1/2005 | LeBlanc | 356/477 |
| 2008/0030742 A1* | 2/2008 | Hill | 356/513 |
| 2008/0121790 A1* | 5/2008 | Grier | 250/251 |

FOREIGN PATENT DOCUMENTS

| | | |
|---|---|---|
| WO | WO 2007/042989 | 4/2007 |
| WO | WO 2008/012767 | 1/2008 |
| WO | WO 2008012767 A2 * | 1/2008 |

OTHER PUBLICATIONS

Schmitt, J. M., "Optical Coherence Tomography (OCT): A Review" IEEE Journal of Selected Topics in Quantum Electronics, vol. 5 No. 4, (Jul./Aug. 1999) pp. 1205-1215.*

(Continued)

*Primary Examiner* — Thomas K Pham
*Assistant Examiner* — Cara Rakowski
(74) *Attorney, Agent, or Firm* — Choate, Hall & Stewart LLP; William R. Haulbrook

(57) ABSTRACT

The invention relates to large-field high-resolution microscopy and photolithography setups operating with polychromatic light. It includes the use of a plurality of focusing micromirrors.

14 Claims, 16 Drawing Sheets

(56) References Cited

OTHER PUBLICATIONS

Cuche, E. et al. "Digital holography for quantitative phase-contrast imaging" Optics Letters, vol. 24, No. 5, (Mar. 1, 1999), pp. 291-293.*

Hell, S. W. et al., "Breaking the diffraction resolution limit by stimulated emission: stimulated-emission-depletion flourescence microscopy" Optics Letters, vol. 19, No. 11, (Jun. 1, 1994) pp. 780-782.*

Walecki, W. J. et al. "Fast in-line surface topography metrology enabling stress calculation for solar cell manufacturing for throughput in excess of 2000 wafers per hour" Measurement Science and Technology, vol. 19 No. 025302 (Jan. 14, 2008) 6 pages.*

International Search Report for PCT/IB2010/050300, mailed Sep. 10, 2010.

Foreign-language Written Opinion of the International Searching Authority for PCT/IB2010/050300, mailed Sep. 10, 2010.

Tiziani, H.J. et al., "Three-dimensional analysis by a microlens-array confocal arrangement", Applied Optics, vol. 33, No. 4, (Feb. 1, 1994), pp. 567-572.

* cited by examiner (a) refractive lens   (b) reflective mirror   (c) solid-immersed mirror (a)   (b)

(a)

(b)

(a) (b)

HIGH-RESOLUTION MICROSCOPY AND PHOTOLITHOGRAPHY DEVICES USING FOCUSING MICROMIRRORS

This application is the U.S. national phase of International Application No. PCT/IB2010/050300, filed 23 Jan. 2010, which designated the U.S., and claims priority to IB Application No. PCT/IB2009/050285, filed 24 Jan. 2009, the entire contents of each of which are hereby incorporated by reference.

FIELD OF INVENTION

The present invention generally relates to high-resolution microscopy and microlithography. Its primary aimed application in the high-resolution microscopy domain would be parallel scanning confocal microscopy, with special emphasis on polychromatic light applications. The primary aimed application in the high-resolution microlithography domain is parallel micro- and nano-structuring based on two-photon polymerization with ultra-short pulsed lasers.

The following description will mainly focus on confocal microscopy, with a few variants of the system presented for demonstrating the versatility of the invention. However, it is understood that the invention can be appropriately adapted to many other high resolution microscopy and microlithography procedures.

BACKGROUND OF THE INVENTION

Basically, confocal microscopy consists in a limitation of the field of illumination and of the field of view by means of spatial filtering of the light [1]. The result is the rejection of out-of-focus light and a precise detection of the light coming from a point in the sample.

The main advantages of confocal microscopy in comparison to wide field microscopy are an improved lateral and axial resolution and a higher signal-to-noise ratio for the detection, e.g. allowing fine slice imaging of a specimen under investigation. However, these advantages are at the cost of discrete sampling, i.e. the specimen has to be scanned point-by-point in order to build a full image. Consequently, image formation can be very time-consuming, depending on the aimed image resolution, the size of the imaged area, the method employed for scanning the sample.

Two main categories of scanning modes can be broadly distinguished: stage-scanning and beam-scanning. The second option has become widely used thanks to the combined use of high performance microscope objectives and very fast beam scanning techniques based on Nipkow spinning disks, acousto-optics or rotating mirrors. This combination is widely used for slice-imaging of biological specimens in order to reconstruct 3D images, or for measuring the topography of microelectronic components. However, scanning is only possible within the imaging area of the objective, and a well known trade-off exists between resolution (defined by the numerical aperture of the objective) and field of view. For example, a microscope objective with a high numerical aperture (NA) around 1.2 is restricted to a very limited imaging area, typically well below 1 $mm^2$. Moreover, the objective needs to be finely corrected from off-axis aberrations all over its field of view, and simultaneously corrected for chromatic aberration if polychromatic light is involved. Such corrections require abnormal dispersion materials in the objective fabrication, often leading to a limited wavelength range of use and to a growth of the objective size, complexity and cost.

In contrast, stage-scanning confocal microscopy can be performed using simpler focusing optics, e.g. only operating for a single on-axis conjugation. Moreover, the possibility of reaching wide-area imaging is brought back as the field of view of the employed focusing elements is not a limitation any longer. Nevertheless, stage-scanning of a large surface with a single focus can be very time-consuming because this method is typically slower than beam-scanning.

A wide-field microscopy and micro-projection system that is not relying on any high-NA objective was proposed by K. C. Johnson in 1997 (U.S. Pat. No. 6,133,986). In this device, the wide-field of a low NA projection system is combined with the relatively high NA of an array of microlenses. This scanning confocal system was designed with special attention to microlithography, an application that is far more demanding than conventional microscopy concerning the imaging field-size requirements. Still, the limitations of this system are the low NA of microlenses (NA<0.6) in comparison to microscope objectives, severely restricting its resolution, especially in the axial direction. Furthermore, microlenses are intrinsically suffering from chromatic aberration, which prevents high resolution with polychromatic light.

PRIOR ART

In U.S. Pat. No. 6,133,986 (1997), Johnson proposed an apparatus for wide-field microlithography printing and confocal imaging based on microlens arrays [2]. But, the restricted numerical aperture (NA) and intrinsic chromatic aberration of microlenses severely limits its resolution and confines its range of application to monochromatic light.

Menon et al. (2006) proposed a parallel scanning confocal microscope based on arrays of miniaturized Fresnel zone-plates [3]. While zone-plates can achieve NAs comparable to the NA of a microscope objective, they are limited to operating at a single designed wavelength, because of the diffractive focusing process involved. Therefore, they cannot function properly with polychromatic light.

In U.S. Pat. No. 5,737,084 (1998), Ishihara proposed a non-scanning alternative for the three-dimensional shape measurement [4]. The use of microlenses with a wide field telecentric objective allows covering large surface of measurement (9.6×9.6×0.64 in [5]). The poor z-resolution because of low NA is compensated by numerical interpolation to reach a declared 1 um resolution (instead of expected 50 um). The 20 um lateral-resolution could be adapted for the industrial application dealing with semiconductor inspection but not for biological imaging.

In U.S. Pat. No. 6,248,988 (2001) Krantz described an apparatus of multispot scanning [6]. The plurality of foci is produced by a microlens array associated with pinhole array. Nevertheless these foci are then imaged by a microscope objective in order to get access to high NA and aberration correction. Thus the scanning is based on a beam deviation technique using acousto-optic (AO) or rotating mirrors.

In U.S. Pat. No. 6,934,079 (2003) Hell proposed the use of microlens array disposed on a rotary disk to split the light beam into several foci [7]. It associates the Nipkow-disk type scanning with a simultaneous illumination via the microlenses thus increasing speed and light efficiency. Again, the performance in term of resolution is related to the use of a well corrected high NA objective with a limited field of view.

The use of a rotating disk containing microlenses was also reported in the description of a confocal multipoint multiphoton excitation microscope [8]. In this kind of pulsed light application associated with large spectral gap between excitation and emission, the chromaticity of the optics has to be a critical point, as well as the proper correction of aberration on the entire field of view of the microscope objective. Micromirror arrays should provide improvement in this domain.

Finally, conventional mirrors in the context of confocal imaging have been explored by Meixner [9]. Interesting capabilities in focusing for confocal microscopy were demonstrated theoretically and experimentally, as well as potential in polarised microscopy.

SUMMARY OF THE INVENTION

The invention relates to a wide field, high resolution microscopy or microlithography procedure and device based on arrays of miniaturized focusing mirrors. The micromirror arrays employed in the present invention are arrays of micro-optical elements having preferably a high numerical aperture (>0.6) and a perfect achromaticity. Such a configuration provides parallel high-resolution operations with polychromatic light that cannot be handled with refractive or diffractive microlens arrays.

Briefly, in the microscopy configuration, a sample under investigation is positioned in the focal area of the micromirror array. Light collected from the sample by each of the micromirrors is relayed onto a light detector array that measures information from the sample in a parallel manner. The system may comprise one or a plurality of small aperture stops for filtering out light that is not originating from the foci of the micromirrors, thus operating in a confocal configuration. If light excitation is needed, micromirrors can be used for focusing it to the sample in a confocal manner, even if polychromatic light is involved. Scanning the sample through the array of foci allows forming an image with a resolution higher than the spacing between micromirrors.

In the microlithography configuration, a sample of photopolymerizable material is positioned in the focal area of the micromirror array. Light whose temporal and spatial intensity profile can be controlled is made incident on the micromirror array for photo-polymerizing the material located at the foci of micromirror. Stage-scanning of the sample synchronized to the writing laser operation thus allows micromachining of two or three-dimensional structures.

DETAILED DESCRIPTION OF THE INVENTION

In the present text the expression "micromirror" has to be understood as a miniaturized focusing mirror with a cross sectional diameter of less than 1 mm, generally between 500 micrometers and 10 micrometers, and with a paraxial radius of curvature that is in the order of magnitude of its diameter. A "micromirror array" has to be understood as a structure composed of several micromirrors positioned on a grid which is not necessarily periodic.

The present invention uses such micromirrors arrays for performing large-field high resolution microscopy and micro-projection that can be operated with polychromatic light. As micromirror arrays are the key element of the proposed invention, two prior art optical components—high numerical aperture (NA) microscope objectives and microlens arrays—will be brought into the discussion for comparison. High-NA microscope objectives are at the basis of state-of-the art confocal imaging systems. Microlens arrays will be brought into the discussion because they can be fabricated in similar array formats as micromirror arrays and could seem to compete with our invention. Nevertheless, microlenses can not afford the comparison with micromirrors due to their intrinsic chromaticity and limited NA.

The present invention will first be illustrated by its possible application to large-field confocal microscopy. A detailed description of the general advantages of using micromirror arrays for microscopy and micro-projection applications will follow. These aspects will be further demonstrated to be important advantages for a variety of other applications, including a fluorescent microarray reader, optical coherence tomography (OCT) and finally two-photon polymerization with ultra-short pulsed laser processes.

First Example

Micromirrors Array for Large Field Confocal Microscopy

Confocal scanning microscopy is a nowadays widely used technique, whether it is for biological or micromanufacturing applications. Since resolution is now brought down the micron, high NA is a requirement and mirrors have the potential to provide it while operating in array format. They can notably improve some of the actual systems limitations. One is the field of view limitation of most confocal microscopes that appears to use beam scanning within a high NA objective. The scan is indeed done within the field of view of the objective, rather small if providing high NA. A single focusing mirror would not overstep this limitation but the present invention proposes to use micromirrors arranged in a two dimensional array in order to perform simultaneous multi-confocal detection for large-field imaging.

Besides, the increasing development of microsystems, particularly for biological and chemical applications, encourages the use of small optical elements that could be integrated into microsystems. The proposed scanning takes advantage of using simpler optical elements, operating only for one on-axis conjugation.

Figure 1:
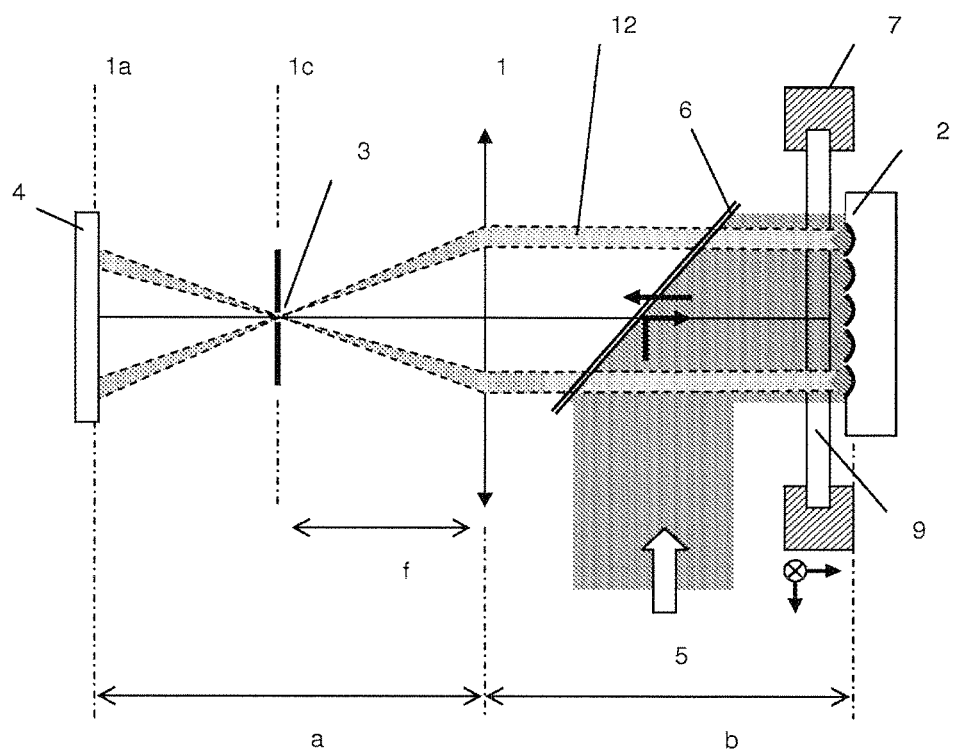
FIG. 1 illustrates the principle of the apparatus which could operate as a multiple confocal scanning microscope based on micromirror arrays.

FIG. 1 illustrates a simple embodiment of the present invention that could operate as a multiple confocal scanning microscope. The apparatus basically consists of a micromirrors array 2 that focuses an illumination beam 5 onto a sample 9. The same micromirrors array collects the light emitted from the sample as a result of the illumination, and directs it towards an array of detector elements 4.

An imaging optical system, schematized by lens 1, images the micromirrors plane onto the detectors plane 1a. Distances a and b are assumed to verify conjugation conditions given by geometrical optics. These distances and the focal length of the relay optics can be chosen to arrange the magnification, therefore adapting the field of view in order that the micromirrors array area fits to the detectors array surface. This optical relay simultaneously allows spatial filtering for confocal detection when an aperture stop 3 is positioned in the Fourier plane 1c of lens 1.

Figure 2:
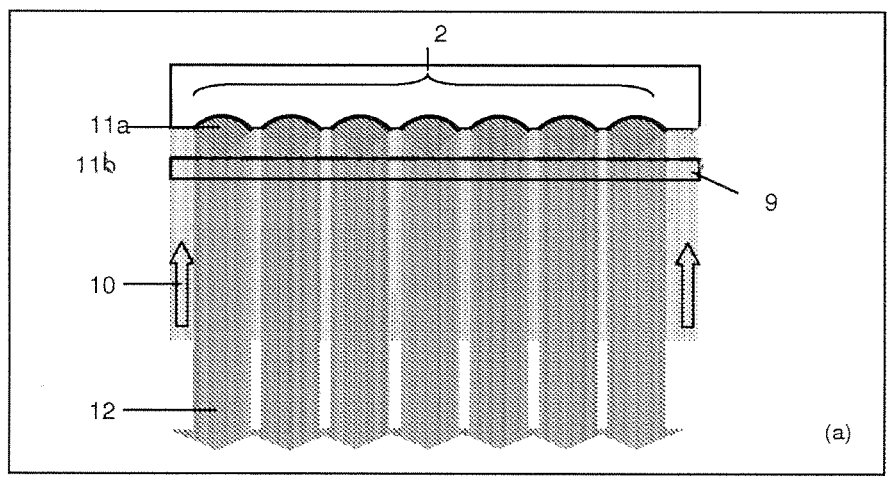
FIG. 2 illustrates a close view of the micromirror array and sample, detailing focusing and light collection by the micromirrors.

The illumination light 5 is merged into the previously described light path by the use of a beam-splitter 6 that reflects illumination light and transmits the collected light. Depending on the application, the beam-splitter can separate light according to its wavelength, its polarisation or without such distinctions. For instance, a dichroic mirror, a polarising cube associated with a quarter- or half-wave plate or a partially reflecting mirror can respectively be used. The collimated illumination 10 is focused by each of the micromirrors, producing an array of foci in the sample and FIG. 2 gives a close up view of the micromirrors area. The light emitted by the sample in response to the illumination 11a is collected by each of the micromirrors. The collected light 11b then propagates as individual collimated beams 12. The signal is spatially filtered by the aperture stop 3 leading to the rejection of out-of-focus light. The light originating from each individual micromirror is independently detected by dedicated sensors element of the detector array. Finally, relative motion between the sample and the micromirrors array can be performed with a translation stage 7, in order to record variations of the sample signal with the changing position and to reconstruct an image.

FIG. 3a illustrates an alternative embodiment of the invention where the relay optical system 1 that images the micromirror array onto the detector array is an afocal optical system schematized by the two lenses 1b and 1d positioned such as their respective focal plane shares the same plane 1c, ensuring amplitude and phase conjugation between the array 2 and the detector 4. The afocal optical system 1 is schematized by the two lenses 1b and 1d positioned such as that their respective focal plane share the same plane 1c. The magnification can still be adjusted by changing the focal length ratio of the lenses composing the afocal system. In this configuration the aperture stop 3 can be used to partially filter the spatial frequencies in the illumination beam in order to provide uniform illumination over the pupil of a micromirror.

This configuration is also particularly suited for individually addressing of the illumination on the micromirrors. FIG. 3b illustrates the use of a spatial light modulator to selectively address the illumination on respective micromirror. The initial illumination coming from the top or from the side (not shown in FIG. 3b) is separated by microreflectors 22 that individually control the deviation angle of each produced illumination beamlet 20. The beamlet 21 is deviated in order to be blocked by the aperture stop 3 and the corresponding micromirror is thus not illuminated. This individual steering of the illumination could be used in a writing process on photo-sensitive materials such as photo-resist (e.g. photolithography techniques). This process is further described in the particular case of two-photon polymerization. Furthermore, in a reading process, as each micromirror scans a particular region of the whole specimen, an addressable illumination allows preserving detection dynamic while imaging specimen with a highly non-uniform fluorescence or reflectivity. With this region-selective illumination, the dynamic range of the detector can be better used leading to better contrast on the image. It can also be applied for preventing cross-talk issues between detectors dedicated to neighbouring micromirrors.

Figure 4:
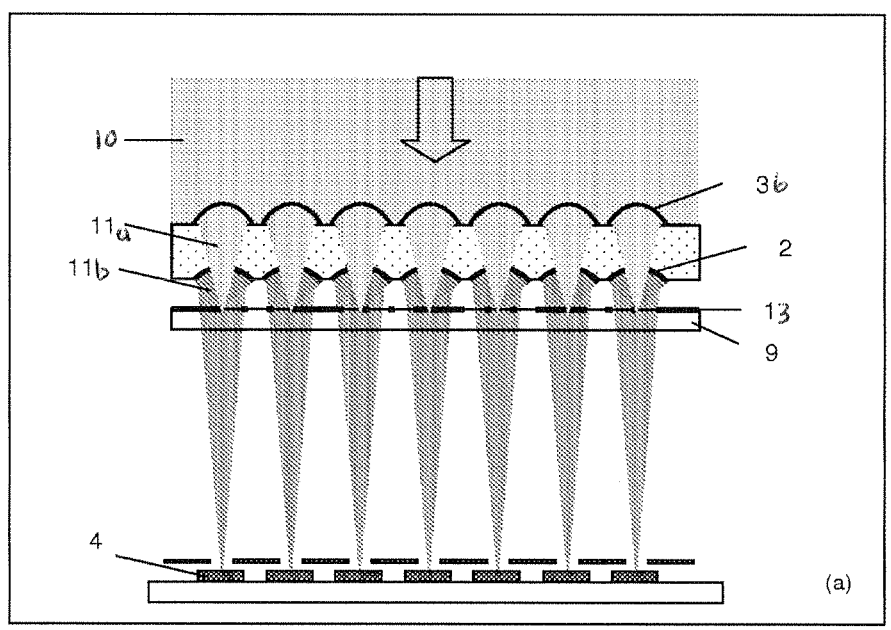
FIG. 4 illustrates an integrated version of the microscopy apparatus based on combined microlenses and micromirror arrays.

The increasing development of microsystems, particularly for biological and chemical applications, encourages the use of small optical elements that could be integrated into microsystems. FIG. 4 illustrates an integrated version of the multi-confocal scanning device, combining microlenses 36 and micromirrors 2 on one substrate. Microlenses are used to provide a localized illumination 11a through transparent or partially transparent micromirrors for the illumination wavelength. Micromirrors collect the light 11b coming from the sample surface 13. The sample surface is conjugated with the detectors array plane 4 and an array of pinholes provides a spatial filtering in order to perform confocal detection, Advantages of Focusing Micromirror Array for Microscopy The key advantages of employing micromirror arrays for microscopy and microlithography applications lie in their high NA, achromaticity and array format. These three main aspects are detailed in the following sections.

Role of High-NA in High-Resolution Imaging and Photo-Lithography

The response to a point source (PSF) is a common reference to estimate the resolution of an optical system. The width of the PSF decreases while the NA increases; consequently the resolution is improved by increasing the NA. This general statement in microscopy applies also to the confocal microscope. In the following, basic equations for the confocal case are given as the present invention has been described above in a confocal microscopy system.

While imaging a point source, the intensity measured in the image plane is given by eq. 1 for a confocal microscope with two equal lenses and for a common wavelength [10]. The intensity is given as a function of the normalised optical coordinate v related to the real radial coordinate r, the wavelength in vacuum λ and the numerical aperture NA. $J_1$ refers to the first order Bessel function of the first kind and eq. 1 is the normal form of the Airy disc.

$$I(v)_{conf} = \left(\frac{2J_1(v)}{v}\right)^4 \text{ with } v = r \cdot \frac{2\pi}{\lambda} NA \qquad \text{eq. 1}$$

The confocal response along the optical axis z is given by eq. 2. The intensity is given as a function of a normalised optical coordinate u related to the real axial coordinate z, the wavelength in vacuum λ, the medium refractive index n and the numerical aperture NA. These relations assume a paraxial approximation, but stay relevant for higher NA.

$$I(u)_{conf} = \left(\frac{\sin(u/4)}{u/4}\right)^4 \text{ with } u = z \cdot \frac{2\pi}{\lambda} \frac{NA^2}{n} \qquad \text{eq. 2}$$

The z-resolution shrinks inversely proportionally with the square of the NA while the radial resolution is inversely proportional to the NA. Consequently an increase of the NA improves more efficiently the axial resolution than the radial resolution. Confocal microscopy has been primarily developed to increase axial resolution. In that sense the increase of the NA can be considered as an even more critical improvement in the confocal case than in the conventional microscopy. As an example, the resolution for optical slicing of specimens drops down from about 20 um to 1.5 um while the NA increases from 0.2 to 0.75. Resolution of 1.5 um and 0.48 um have been reported with respectively NA 0.75 [11] and NA 1.3 objective lens [12] in epi-fluorescence imaging with a confocal laser scanning microscope (CSLM). These numbers are in good agreement with the said evolution of the resolution and show the practical impact of numerical aperture.

The increase of NA not only improves the resolution but also increases the light collection efficiency, thus enhancing the signal on the detector. Moreover, light is more specifically collected from the image plane, reducing noise and consequently enhancing the signal-to-noise ratio (SNR). For an isotropic emission the proportion of collected light shows a square dependency on the NA within a paraxial approximation: as the NA is doubled, the amount of light collected can be multiplied per 4 and thus, for example, the time of imaging is divided per 4 or the signal-to-noise ratio can be increased. The collection efficiency grows even faster for high NAs (beyond the paraxial approximation). Taking into account the emission diagram of an emitter, the increase in light collection with NA can even be higher (see Application for fluorescent array reader).

Finally, the NA determines the excitation volume, which is highly related to the resolution and sensitivity issues but is of particular interest for applications like fluorescence correlation spectroscopy (FCS) that require minimized excitation and detection volumes.

Therefore, the NA is a critical parameter for highly resolved confocal imaging. Even if microlenses have been proposed for wide-field confocal microscopy (U.S. Pat. No. 6,133,986) it has to be noticed that they are limited as regard to numerical aperture commonly achievable.

Figure 6:
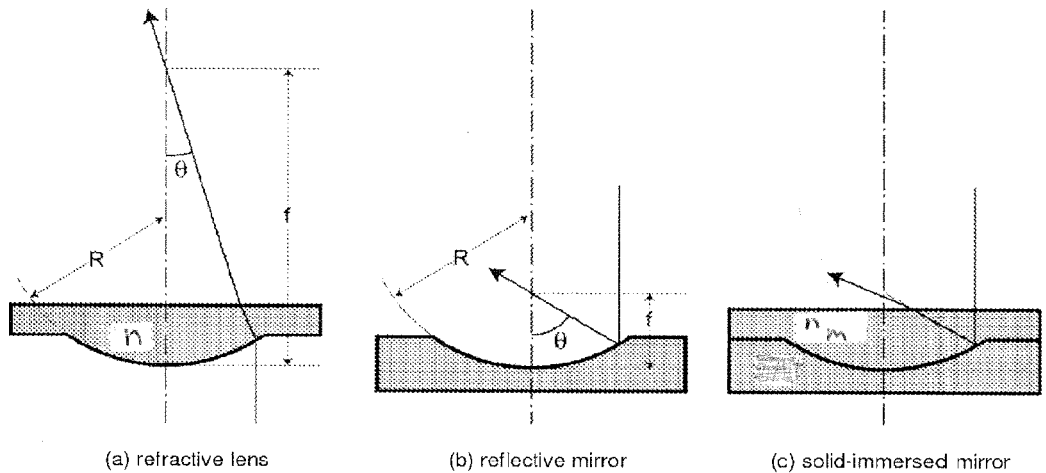
FIG. 6 illustrates a comparison between a refractive and a reflective system regarding the focal length and the numerical aperture.

FIG. 6 illustrates a comparison between a refractive and a reflective system in the air. We first consider a spherical diopter of curvature radius R. In the paraxial approximation, the focal length of a refractive lens is basically given by eq. 3:

$$f_{ML} = \frac{R}{n-1} \qquad \text{eq. 3}$$

where n is the index of the lens material. When using the same dioptre in reflection (mirror) the relation becomes independent of n, eq. 4.

$$f_{MM} = \frac{R}{2} \qquad \text{eq. 4}$$

Considering an usual refractive index value (about 1.5) of the material for lenses it is straightforward that lenses will show much longer focal length f, thus lower NA, for an equivalent radius of curvature and cross sectional diameter These paraxial approximations basically explains why a micromirror can offer a much higher NA than a microlens. At higher NAs (smaller curvature radiuses R) the global effect remains the same, adding that microlenses suffer from an apodization effect with high angles. Reflectivity at the refractive interface indeed increases with the angle, leading to losses in transmission of the light at high NA. Moreover, a comparable NA between a micromirror and a microlens would request a smaller radius of curvature for the lens which increases the manufacturing difficulties, not mentioning the fact that the focus needs to remain out of the lens itself.

Besides its naturally higher NA for the same curvature than a microlens, the micromirror allows a further increase of the NA by changing the refractive index of the medium where reflection takes place. As illustrated in FIG. 6c the micromirror can be filled with a medium of refractive index $n_m$ providing an $n_m$ fold increase of the NA in comparison with free space. As an example, the solid-immersed mirror (FIG. 6c has a six times higher NA than the plano-convex lens (FIG. 6a) if we consider a refractive index of 1.5 for both, in a paraxial approximation.

Figure 5:
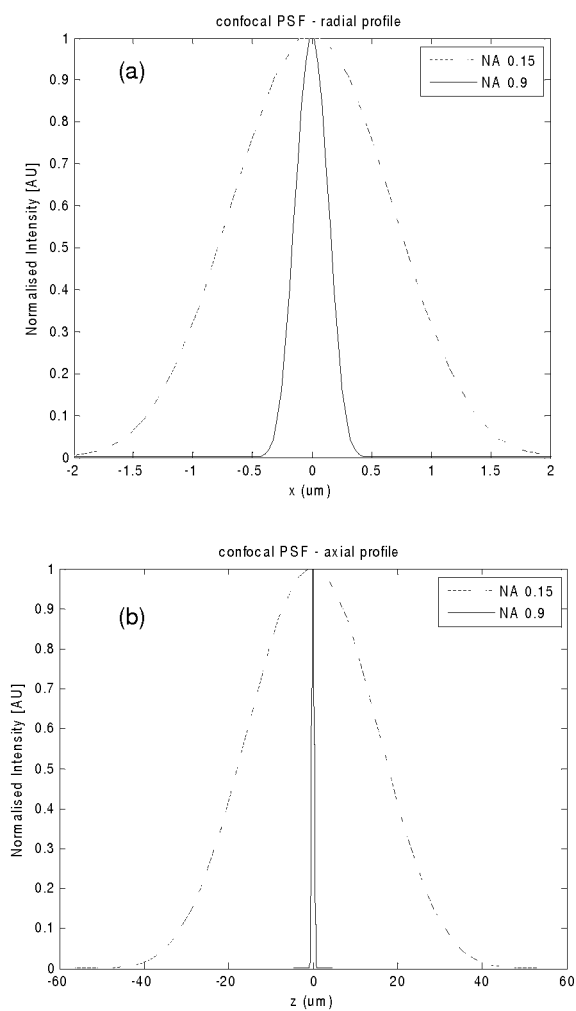
FIG. 5 illustrates transverse and longitudinal point-spread-functions at numerical apertures corresponding to typical microlenses or micromirrors

FIG. 5 shows theoretical confocal PSFs that can be achieved with numerical apertures of 0.9 NA and a 0.15 NA. These are typical values of NA that can be respectively achieved with a solid-immersed micromirror and a plano-convex microlens characterized by the same radius of curvature and cross-sectional diameter. The calculation, based on a vectorial diffraction model [9], assumes a wavelength of 633 nm. The radial PSF profile calculated in the focal plane is plotted in FIG. 5a. Its width shrinks in the same proportion than the ratio of 6 between the two compared NAs. The axial PSFs are illustrated on FIG. 5b, showing that the axial resolution increases dramatically with the numerical aperture. The ratio between both widths is about 50 for the axial PSF, meaning that the shrink ratio with high NA shows an even more than the square dependency on the NA expected with the paraxial approximation.

Over spherical dioptre previously described, other shapes can provide similar advantages regarding the NA but for different on-axis optical conjugation. Among the different cross-sectional profiles that can be used for focusing and collecting light the parabolic one is of particular interest as it allows focusing parallel light travelling along its optical axis to a single point without spherical aberrations. This is particularly suitable to the embodiments of invention similar to the ones illustrated in FIG. 1 and FIG. 3. As another example, a mirror with an elliptic profile producing a perfect optical conjugation of two points on its optical axis of the mirror would be optimal in the embodiment presented in FIG. 4.

Achromaticity

Chromatic aberrations are not tolerable in high-resolution microscopy systems operating with polychromatic light. Due to the inevitable dispersion properties of optical substrates, the focal length of a simple refractive lens is critically dependent on the wavelength. In a microscope objective, chromatic aberrations can be corrected by using several lenses composed of materials with compensating dispersion properties. However, because microlens arrays are typically monolithic structures fabricated on a flat substrate, they inevitably exhibit chromatic aberrations.

In contrast, the focal length of the micromirrors employed in the present invention is totally independent of wavelength, due to the nature of the reflective (instead of refractive) focusing process involved. As a consequence, a microscope system based on micromirror arrays would not be restricted to operating with a single wavelength: its performance will be optimal at any wavelength within the spectral extension where the mirror surface has sufficient reflectivity. The achromatic property of micromirror arrays may thus allow high performance operation with multiple lasers wavelengths or polychromatic light sources such as broadband lasers or ultra-short pulsed lasers (i.e. pico- or femtosecond lasers). In certain conditions, spatially incoherent light sources may also be used, including Mercury or Xenon arc discharge lamps or super-luminescent light emitting diodes (sLED).

Concrete examples that would highly benefit from achromaticity of micromirror arrays include, for example, confocal fluorescence microscopy. Biological specimens under investigation are typically tagged with fluorescent dyes whose spectrally extended emission wavelength is sensibly separated from the excitation wavelength. As confocal imaging systems aim at rejecting out of focus light, any chromatic aberration would prevent the accurate co-localization of the excitation and detection volume, resulting in a loss of signal and a severely reduced resolution.

Since micromirror arrays employed in the present invention are achromatic, accurate confocal excitation and detection is achieved with high precision. Labelling of biological specimens with quantum dots (Qdots) is more and more popular, because a single excitation source (e.g. in the ultra-violet range) is sufficient for exciting several types of Qdots re-emitting light at very distant wavelengths. Thus achromaticity is a key characteristic of high performance imaging techniques employing Qdots. Two-photon excitation and second harmonic generation are other examples of imaging techniques where the excitation and the emission spectra takes place at sensibly separated wavelengths, which are thus well adapted for operating with achromatic micromirror arrays.

High-NA combined with achromaticity allows the precise focus of several wavelengths at the same plane to increase the local density of energy. This can be exploited in applications such as, e.g. micro-machining, micro stereo photolithography, laser deposition and -etching, or, in order to produce non-linear effect into the sample. It can be used for pulsed light application in fluorescence like Fluorescence Recovering After Photobleaching (FRAP). It can also be of particular interest for Stimulated Emission Depletion microscopy (STED) where two separated wavelength have to be used for the illumination process. STED combines annular illumination for the depletion at a given wavelength with a central illumination at another wavelength to excite fluorescence, increasing resolution beyond the diffraction limit.

Note that the reflective configuration implies that the object has to be partially transparent within the wavelength range used. This is the case for most thin biological samples in the visible spectrum. Adapting the operational wavelength range to the particular sample is often possible. For example, silicon is partially transparent to infrared light, thus semiconductor inspection may be possible at these wavelengths with micromirror arrays.

Scanning with Multiple Focusing Elements for Large Field Imaging

Parallel Imaging

While the field of view of a single focusing micromirror is typically very restricted, using an array of micromirrors allows performing parallel microscopy. Each micromirror is performing a confocal detection and each measurement is recorded in parallel. The array detector gets simultaneous information from the multiple corresponding foci, but in order to acquire a complete image of the sample, the latter needs to be scanned by this multiplicity of foci.

Figure 7:
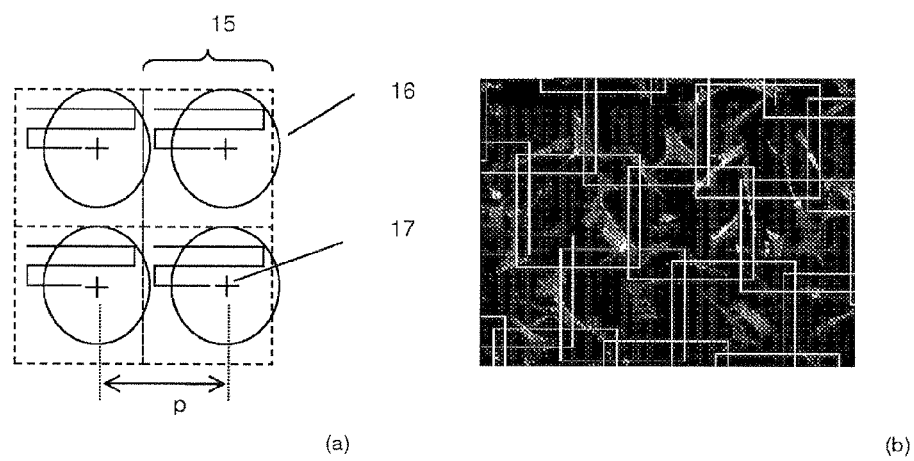
FIG. 7a illustrates bidirectional scanning over an area sized by the pitch of the array, not by the field of view desired.
FIG. 7b is part of a mosaic image of fluorescently labelled actin filaments grown on the surface of a microscope slide.

FIG. 7a shows a part of the micromirrors array restricted to four mirrors. It illustrates that the object has to be move over an area sized by the pitch p of the array in order to provide a complete image. The resulting image size is however related to the number of single mirrors 16 (therefore the size of the array) rather than to the scanned amplitude. This is the basic principle of parallel imaging leading to a field of view that is uncorrelated to the scanning range.

Figure 18:
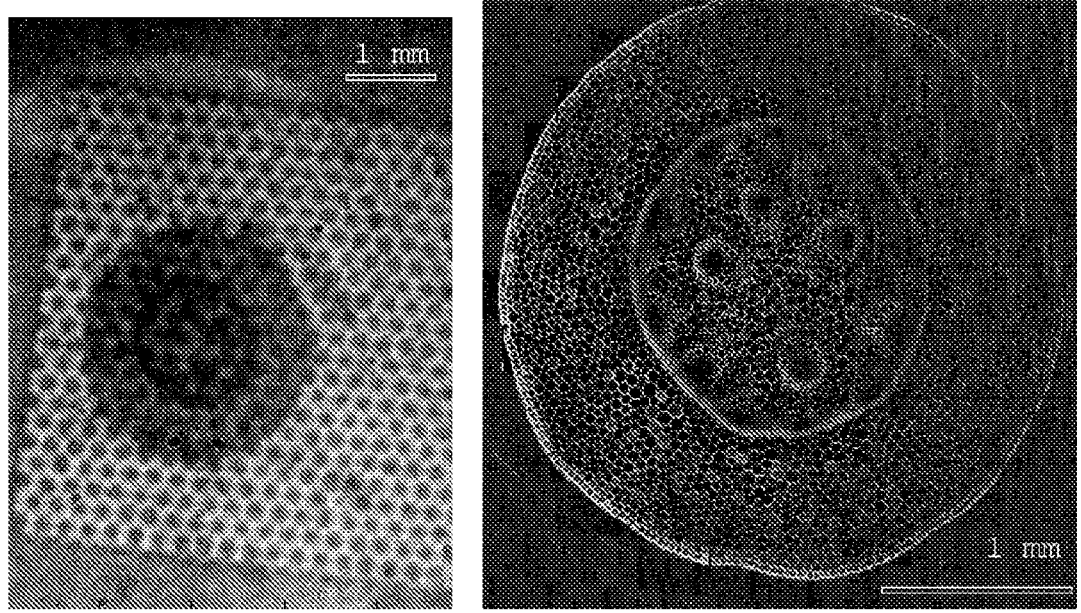
FIG. 18a shows a transmission image of a specimen (stained slice of a convollarias' root) with the micromirror array in the background.
FIG. 18b is an experimental fluorescence confocal image of a stained slice of a convollarias' root acquired with the micromirror array.

The field of view to be imaged is divided into cells 15 sized by the pitch p of the micromirrors array. Each cell is scanned by its corresponding micromirror focus 17, providing a part of the global image. In the example shown in FIG. 7a the scan is bidirectional. By numerically assembling the cells next to each other, the global image is formed as illustrated in FIG. 7b, showing part of an experimental confocal image of fluorescently labelled actin filaments grown on the surface of a microscope slide. Each square on the image represents the limits of a cell acquired with a single micromirror by the bidirectional scan. Note that FIG. 7b only shows a restricted portion of the global image, as only the data recorded by a few mirrors is shown. The global image corresponded to a 5×5 mm$^2$ field of view, which corresponds to the size of the micromirrors array used in the experiment (see FIG. 18 for a global image with 5×5 mm$^2$). Such a large field of view is acquired with very small scanning amplitudes corresponding to the pitch in the micromirror array, here 250×250 microns. The pattern of the micromirror array used in this experiment was not square but hexagonal, which explains that the arrangement of the cells differs from FIG. 7a. The pixel size is 2 microns; it corresponds to the amplitude of a single scanning step used for acquiring the image.

Figure 8:
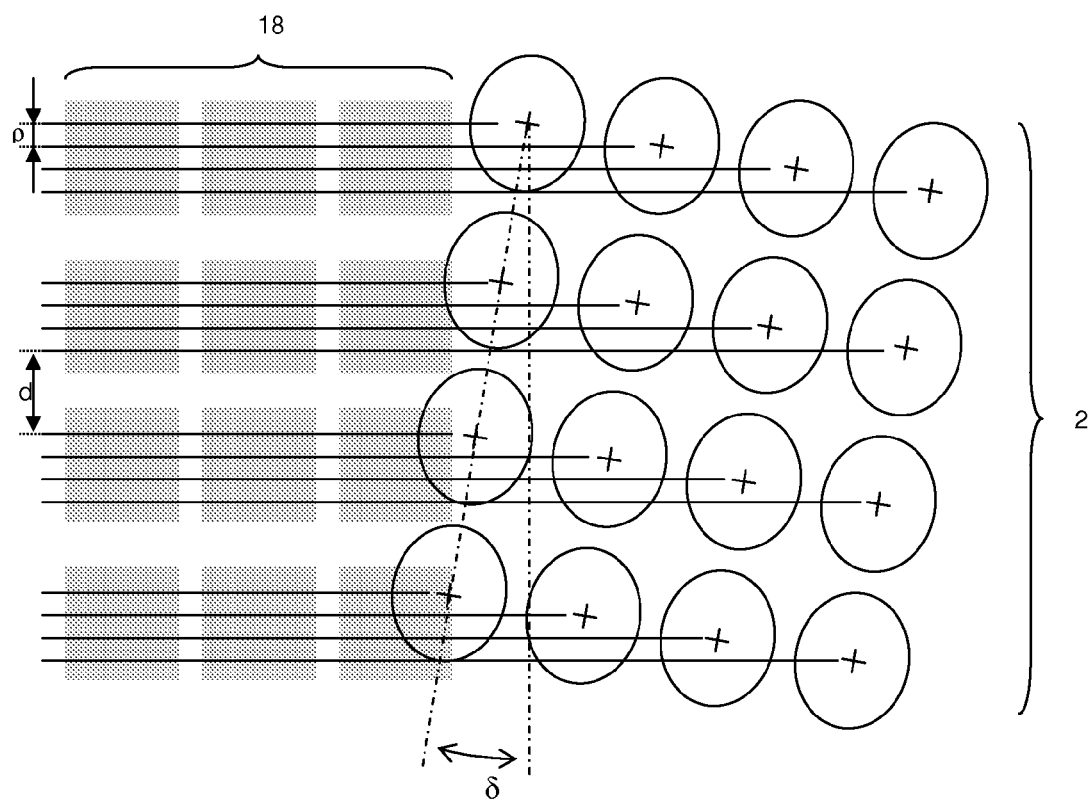
FIG. 8 illustrates how parallel detection can be used for high resolution imaging of patterned regions of interest, through unidirectional scanning.

FIG. 8 illustrates how parallel detection can be used for high resolution imaging through simple linear scanning. The image resolution ρ is given by the tilt angle δ between a main axis of the array and the scanning direction. The distance d between each group of line scan depends on the number of micromirrors available and this number does not suffer any theoretical limitation. A typical application of interest would be the fast unidirectional scan of a fluorescence microarray (see the fluorescent microarray reader in Others examples of Application). FIG. 8 illustrates such a possibility, adapting the tilt between the array and the direction of line scanning in order to fit a fluorescent pattern 18. In the example of a fluorescent microarray, specific biochemical reactions are localized on individual patterned areas over the surface to image. Each grey square in FIG. 8 then corresponds to one of the regions of interest where the signal of fluorescence has to be acquired from.

Positioning Feedback

Autofocus—Axial Positioning

While scanning a sample for imaging its surface fluorescence, the focus needs to be maintained on the said surface. The distance between the surface and the focusing optics varies during the scanning procedure for mechanical reasons or because of the non-planarity of the sample substrate. An axial position feedback is then necessary to compensate the effect of defocus in the detection process. This feedback can be used to actively adjust the position of the sample in a closed-loop procedure or can be taken into account during image processing to normalize the measured intensity pixel to pixel.

Figure 3:
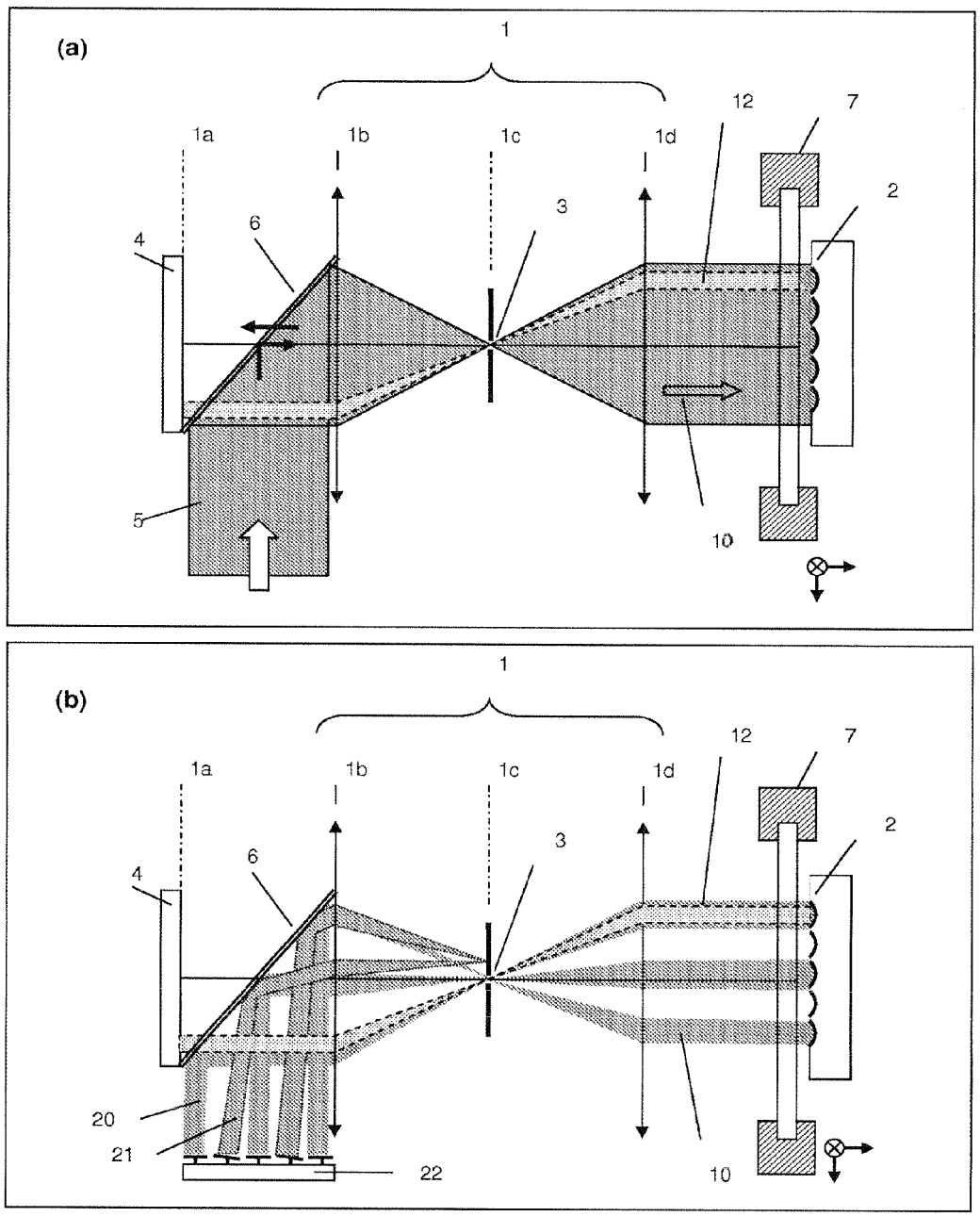
FIG. 3a illustrates another variant of the apparatus, employing an afocal telescope system between the micromirror array and the detector.
FIG. 3b illustrates a variant allowing individual addressing of the illumination on the micromirrors.
Figure 9:
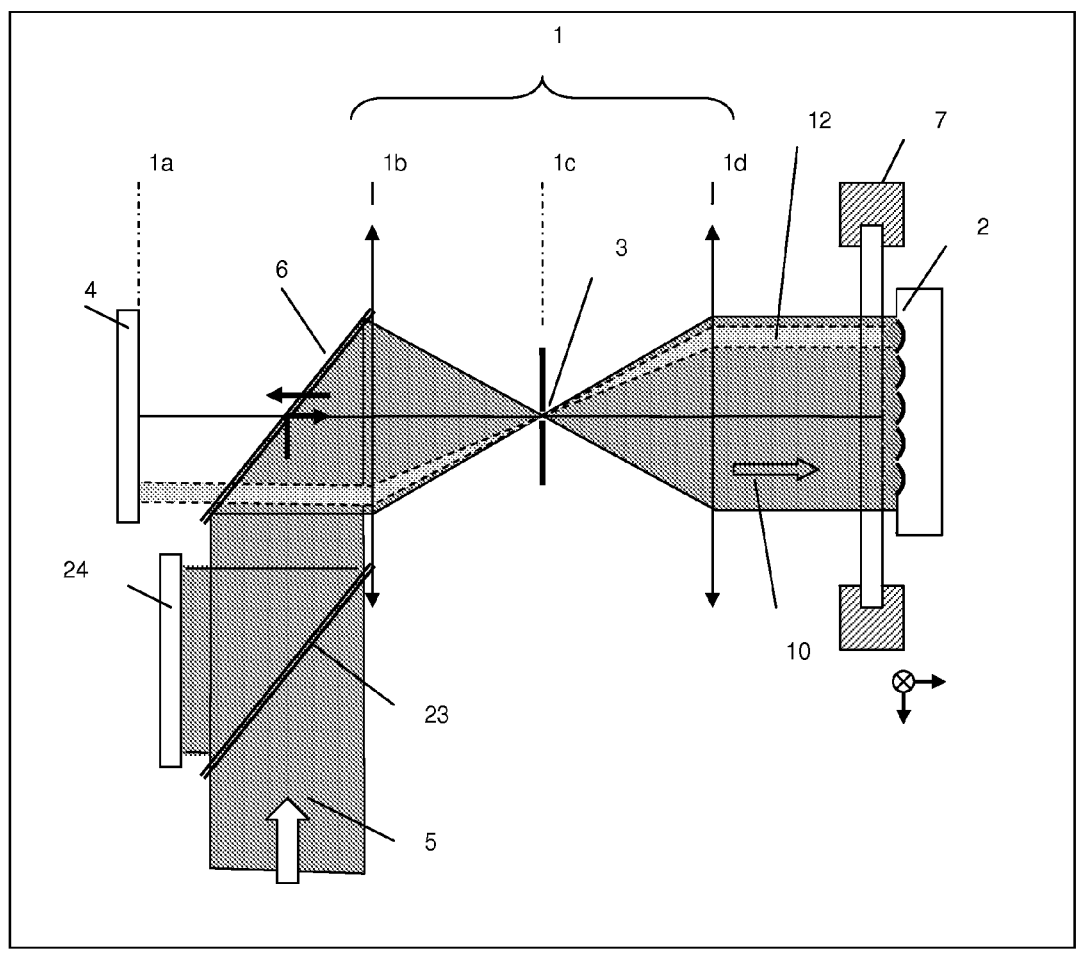
FIG. 9 shows an alternative setup including the monitoring of the back-reflected light by the sample

The confocal set-up described in FIG. 3 can be either used for fluorescence microscopy or for topographic study of the sample. Both applications can be combined. FIG. 9 shows an additional part composed of a detector array and a beam splitter. The beam splitter 23 is inserted in the illumination path and partially transmits the illumination light back-reflected by the sample towards the detector array 24. For instance, the beam splitter could be a semi-transparent mirror or a combination of a quarter-wave plate and a polarising beam splitter. The achromaticity of the micromirrors is a key advantage as it allows using the same aperture stop. Therefore, the distance measured strictly corresponds to the fluorescence detection plane position.

Figure 10:
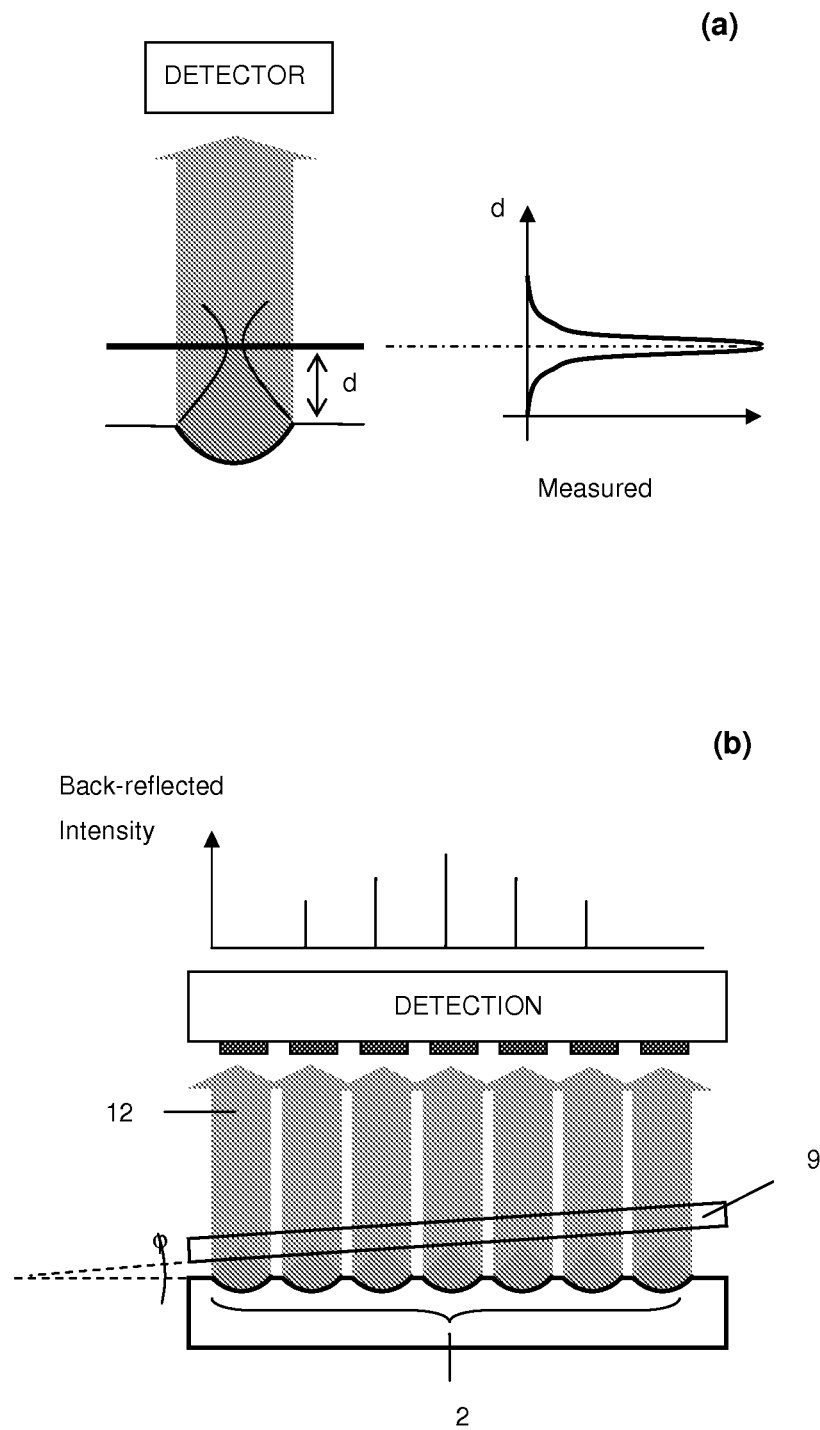
FIG. 10a illustrates how distance can be estimated from the back-reflected illumination monitoring
FIG. 10b illustrates how back-reflected intensity monitoring over the whole array of micromirrors provides information on the relative position of the sample.

FIG. 10a shows how the variation of the distance d between the sample and the foci of a micromirror would result in a variation of the back-reflected light intensity. Therefore the relative distance between each micromirror and the sample surface can be followed during the scanning procedure by monitoring the back-reflected intensity collected by each micromirror.

Besides positioning feedback, the back-reflected light monitoring allows the compensation of the source intensity fluctuation. The multiplicity of simultaneous measurements done by the multiplicity of micromirrors allows discriminating between local variations of intensity due to the scanned object and global fluctuations encountered for all micromirrors due to the source fluctuation for example. This monitoring of the back-reflected light regarding the variation of the distance d is the basis of topographic measurements on the sample.

At a given position during the scanning process, the global surface topography of the sample can be reconstructed by comparing the relative intensity variations recorded from each micromirror in array. A particularly valuable use of this topographic information is the compensation of a tilt angle between the sample plane and the micromirror plane. FIG. 10b shows an example of the detected signal resulting from a tilt between the sample surface and the micromirrors plane.

Image Resolution—Lateral Positioning Measurement

In scanning microscopy the resolution depends particularly on the positioning precision while scanning the sample. As the image is reconstructed following the relation between position and corresponding measured signal, the image quality can be deteriorated by imprecise position measurement. Positioning feedback allows using closed loop positioning system that compensate non-linearity, hysteresis and drift issues.

The use of an array of focusing elements to provide parallel imaging allows dedicating some of these elements to a positioning feedback. One or several micromirrors can be used to record the image of a local known pattern in order to give a 2D or 3D position feedback. The achromatic property of the mirror allows using a different wavelength for the feedback than the one used to image the sample. Therefore image information is easily separated from the positioning information with a dichroic beam-splitter. Along the optical axis a refractive index structure can be obtained with dielectric coating procedures. Surface 2D pattern can be printed by photolithography or etched by e-beam lithography. Photopolymers is an interesting alternative that allow 3D patterning.

Other examples

Fluorescent DNA or Protein Micro-Array Reader

An application of particular interest for the present invention is the detection of fluorescent molecules at the surface of a glass slide [13]. DNA or protein micro-array readers currently rely on confocal scanning techniques to increase the detection signal-to-noise ratio. As DNA or protein microarrays operate on quite large supports (such as microscope slides), a wide-field confocal scanning technique like the one presented in the present invention offers a great potential.

Figure 11:
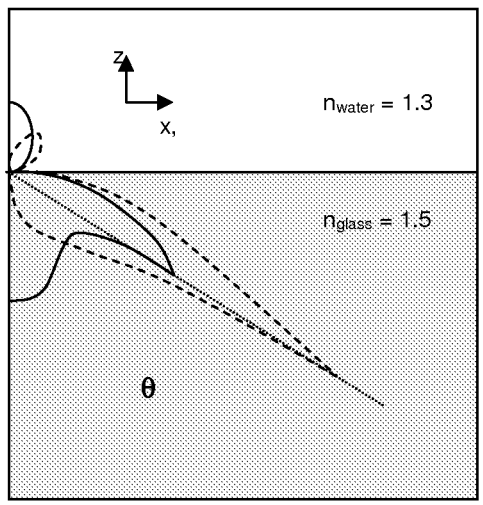
FIG. 11a illustrates the anisotropy of emission for a dipole emitting at the boundary between two different refractive media.
FIG. 11b illustrates a configuration of the micromirror apparatus exploiting the anisotropy of emission described in FIG. 11a for a better collection of the fluorescence light.
Figure 11:
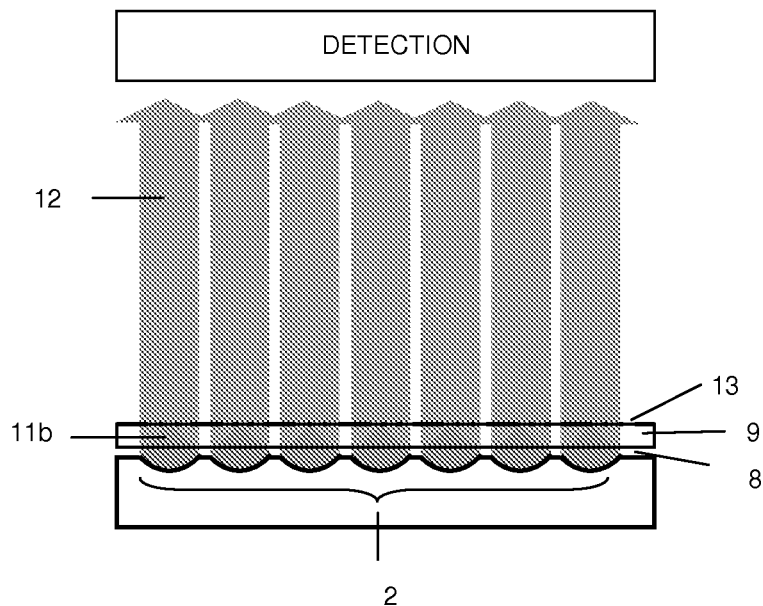

It is well known that the fluorescence emitted from a dipole at the surface of a glass slide is mainly directed towards the glass slide which has a higher refractive index. FIG. 11a illustrates the anisotropy of emission for a dipole emitting at the boundary between two different refractive media. The spatial distribution of emission depends on the orientation of the emitter with respect to the surface of the substrate: solid curves are for a parallel-oriented dipole; dashed curves, for a perpendicularly oriented dipole. For both orientations, the polar plots show an intensity maximum pointing in the direction of the critical angle of total reflection $\theta_c$, and the proportion of light emitted towards the highest refractive index increases with the refractive index contrast. Therefore, an efficient detection of the emitted fluorescence light requires its extraction from the highest index media, as most of it is propagating along the total internal reflexion angle. The high NA achievable with micromirrors, particularly in the configuration shown in FIG. 11b where micromirrors are focusing across the glass slide through a refractive index adaptive layer 8, permits such an extraction. This is a clear application example where benefits can be taken of using micromirrors instead of microlenses for optical detection, because of the high achievable NA of micromirrors. Moreover, their achromaticity ensures that the plane of maximal intensity of light excitation and the plane from where the fluorescence is optimally collected are co-localized. Also, DNA or protein microarrays are typically patterned at a similar scale as micromirror arrays (hundreds of microns), which may show advantages for sample scanning over large surfaces in comparison to scanning systems based on a microscope objective (see FIG. 8 for an example). Finally, due to their small size, micromirror arrays may be integrated in portable DNA or protein microarray readers performing massively parallel confocal detection.

Optical-Coherence Microscopy with Micro-Mirror Arrays

Other examples for applying advantageously micro-mirror arrays are imaging techniques based on interferometer schemes for illuminating the sample, such as, e.g. Optical Coherence Tomography (OCT) or Digital Holographic Microscopy (DHM). Such phase sensitive techniques allow achieving nanometer resolution in axial direction and high detection sensitivity.

Figure 12:
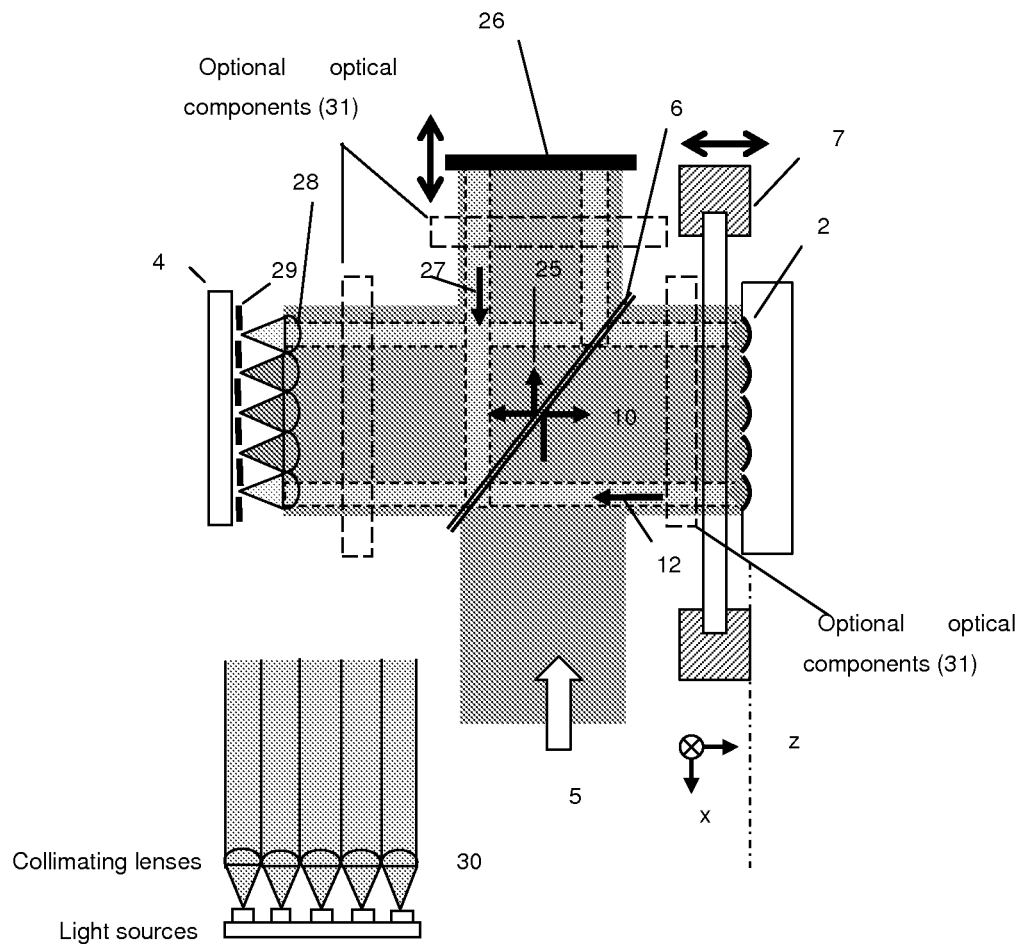
FIG. 12 shows a simple schematic arrangement of a time-domain OCT based on micromirrors.

Optical Coherence Tomography:

OCT is based on a broadband illumination of the sample and subsequent cross-correlation detection of the reflected light. The technique has become popular for imaging in scattering media, e.g. translucent materials and biological tissue, since the coherent detection process allows suppressing efficiently scattered light and achieving single photon detection sensitivity. The original development was based on fiber interferometers [14], but it has been rapidly recognized, that using bulk interferometers and detector arrays allows for detecting a multitude of pixels simultaneously thus reducing the image acquisition time accordingly [15]. FIG. 12 shows a simple schematic arrangement of a time-domain OCT based on micromirrors. A collimated beam from the light source (5) is directed towards a 50% beamsplitter (6) that directs one part of the light beam (object wave, 10) to the micro-mirrors (2) and the second part of the light (reference wave, 25) to a reference mirror (26). The back-scattered light from the focal zone of the micro-mirrors is reflected at the micro-mirrors and directed (12) to the beamsplitter (6), where it recombines with a part of the light (27) reflected at the reference mirror. The recombined light from the object and reference wave propagates to a detector array (4). An array of micro-lenses (28) may be used, e.g., for focusing the beamlets onto the detector array. The dimensions of the individual detector elements or an additional spatial filter (29) can be used for achieving confocal imaging conditions. Interference is observed, if the optical path lengths for the object and the reference waves of the interferometer are equal within the coherence length of the light source. A variation of the path length for the object or the reference wave, by, e.g., moving the reference mirror in the direction of the arrows along the optical axis will change the phase of the interfering light. In a preferred embodiment, the polarization states of the object and reference waves are identical. The total light power P of the object wave $P_o$ and the reference wave $P_r$ impinging on a detector element is given by:

$$P(\tau) = P_o + P_r + 2\sqrt{P_o \cdot P_r} \cdot |\gamma_{o,r}(\tau)| \cdot \cos(\phi) \qquad \text{eq. 5}$$

Here, $\tau$ corresponds to the travel time difference of the light between the two paths, $\gamma$ is the normalized cross-correlation function, and $\phi$ indicates the phase difference between reference and object wave. In typical OCT arrangements $P_0$ and $P_r$ depend linearly on the light power coupled into the interferometer. Denoting the power coupling coefficients with $c_{1,2}$, and assuming power reflectivities of 1 and R at the end of the reference and for a single scattering point in the sample arm, respectively, the power at the detector is:

$$P(\tau) = P_0[c_1 + c_2 \cdot R + 2\sqrt{c_1 \cdot c_2 \cdot R} \cdot |\gamma_{1,2}(\tau)| \cdot \cos(\phi)] \qquad \text{eq. 6}$$

Note that the constants would be $c_1 = c_2 = 1/4$ for a perfect and loss-less beam-splitter characterized by power transmission and reflection coefficients of 0.5. In typical time domain OCT arrangements, a periodic variation of the phase difference $\phi$ is generated by either vibrating the reference mirror at an amplitude on the order of the wavelength or by moving it at a constant speed perpendicular to the mirror plane. The frequency of the reflected reference wave is Doppler shifted and the phase of the recombined reference and object wave changes periodically. For photodetectors, the signal current J is proportional to the light power incident on the light sensitive area. It is composed of a DC and AC part. They are given by:

$$J_{DC} = r \cdot P_0[c_1 + c_2 \cdot R] \approx r \cdot c_1 \cdot P_0 \qquad \text{eq. 7}$$

$$J_{AC} = 2 \cdot r \cdot P_0 \sqrt{c_1 \cdot c_2 \cdot R} \cdot |\gamma_{1,2}(\tau)| \cdot \cos(2\pi f_D t) \qquad \text{eq. 8}$$

The approximation in eq. 7 holds for small reflectivity coefficients R of the backscattered light from the object. The modulation frequency $f_D$ is determined by the amplitude modulation or the scan speed of the mirror. For the latter case, e.g., $f_D$ depends on the reference mirror velocity $v_{scan}$ by:

$$f_D = 2 \cdot v_o \cdot v_{scan}/c \qquad \text{eq. 9}$$

where vo is the original frequency of the light source and c is the speed of light. AC-coupling at the light detector exit allows separating the signal from the micro-mirror's focal point from the DC-background light in the interferometer. Subsequent quadrature of the AC-signal yields an output signal that is proportional to the object reflectivity at the micro-mirror's focal point. The first part of the signal processing can be performed at the level of the detector element, using e.g. smart pixel arrays [16]. Analog electronic circuits, A/D converters and subsequent digital signal processing is usually used for extracting the information on the object. Scanning the reference mirror, recording its position, and correlating the position with the measurement signal from the object allows to record reflectivity profiles within the sample with a resolution that is given by the bandwidths of the illumination source. Assuming a light source with a Gaussian spectral light distribution the axial resolution $z_r$ is given by:

$$z_r = L_c/2 = 2 \cdot \text{Ln}(2) \cdot \lambda_0^2/(\pi \cdot \Delta\lambda) \qquad \text{eq. 10}$$

where $L_c$ is the coherence length and $\lambda_0$ and $\Delta\lambda$ are the central wavelength and the FWHM-width, respectively, of the spectral light distribution incident on the detector elements. In a preferred embodiment light sources with a large spectral bandwidth (e.g., LEDs, Ti:sapphire lasers, luminescent fibers, short-pulse lasers combined with photonic crystal fibers) are used for achieving high axial resolution. The lateral resolution is given by the numerical aperture of the micromirrors. If the depth scan gets outside the Rayleigh length of the focal zone, the lateral resolution and the light collection efficiency degrade rapidly. In such cases it might be preferable to wobble the reference mirror with a periodic signal, e.g. of triangular or sinusoidal form, for generating the light modulation and to perform the depth scan by moving step by step the specimen relative to the micro-mirror array at constant position of the micro-mirror array. Other procedures have been reported in the literature for eliminating the out of focus problem for OCT-microscopy [17-19].

The basic experimental arrangement can be modified in many ways in order of increasing the performance or of adapting the arrangement for measuring specific parameters for the object under investigation (see e.g. [20]): Light at specific polarization states (linear, circular) can be used for the illumination of the interferometer, polarizing beamsplitters can replace the 50% transmission beamsplitter (6), and optional optical elements (31), such as, e.g., polarizers, dispersion compensating plates, circulators, light modulators, phase plates, can be inserted into the light path for measuring birefringence [21], absorption [22], characterizing the speed of moving objects, e.g. measuring flow profiles in liquids or gases [23]. Other interferometer configurations may be used advantageously instead of a Michelson interferometer (see, e.g. [24]). The collimated and spatially coherent illumination wave (5) from a single light source can be replaced by a bundle of individually collimated light sources originating from a LED-VCSEL-, or fiber bundle array (30), arranged preferably in a way that all micro-mirrors are illuminated by exactly one light emitting element. There is no coherence between the light waves emanating from different emitters and this allows reducing the coherent cross-talk and improving the signal-to-noise ratio in highly scattering objects [25]

OCT-arrangements can also be used for topography imagery using phase-shifting interferometry (PSI) for obtaining high-resolution three-dimensional topographic images of relatively smooth surfaces [26]. PSI requires the acquisition of several frames of interferograms for calculation of a phase map [27]. Then a topographic image can be obtained after the $2\pi$ phase jumps are removed by a process known as phase unwrapping [28]. In PSI the phase can be shifted step by step between subsequent measurements or continuously while the interference signal is being integrated. In this so-called integrating-bucket technique, the phase is usually shifted linearly in a sawtooth-like manner [29]. Compared with phase stepping, this technique permits faster operation. The use of photodetectors, i.e. the assumed linear relationship between input and output signal of the detector element, is not a necessary condition for achieving OCT measurements.

Detectors with nonlinear responses such as, e.g. thermal detector arrays may be used as well, provided that the modulation frequency $f_D$ is below the cut-off frequency of the detector elements.

The so called spectral-, frequency-, or Fourier-domain OCT can also be applied with micro-mirrors. Here, the broadband interference is acquired by encoding the optical frequency in time with a spectrally scanning source [30] or with a broad band light source and a dispersive detector, like a grating or prism combined with a detector array [31]. Due to the Fourier relation between the auto-correlation and the spectral power density (Wiener-Khintchine theorem), the depth scan can be immediately calculated by a Fourier-transform from the acquired spectra, without movement of the reference arm. This feature improves imaging speed dramatically and leads to a gain in the Signal-to-Noise ratio. The broadband light source (5) in FIG. 12 is replaced by, e.g. a collimated beam from a laser source with large gain profile e.g. a Ti:sapphire or a fiber laser, that allows to scan the laser frequency in time. The readout of the detector array is synchronized with the scanning of the laser frequency and stocked in digital form in the memory of a PC. The sequence of read-outs from a full scan corresponds to the digitized spectrum that has been captured by a pixel. A fast Fourier transform allows calculating the reflectivity depth profile for this pixel. A 3-D tomogram of the specimen is then obtained without scanning.

Figure 13:
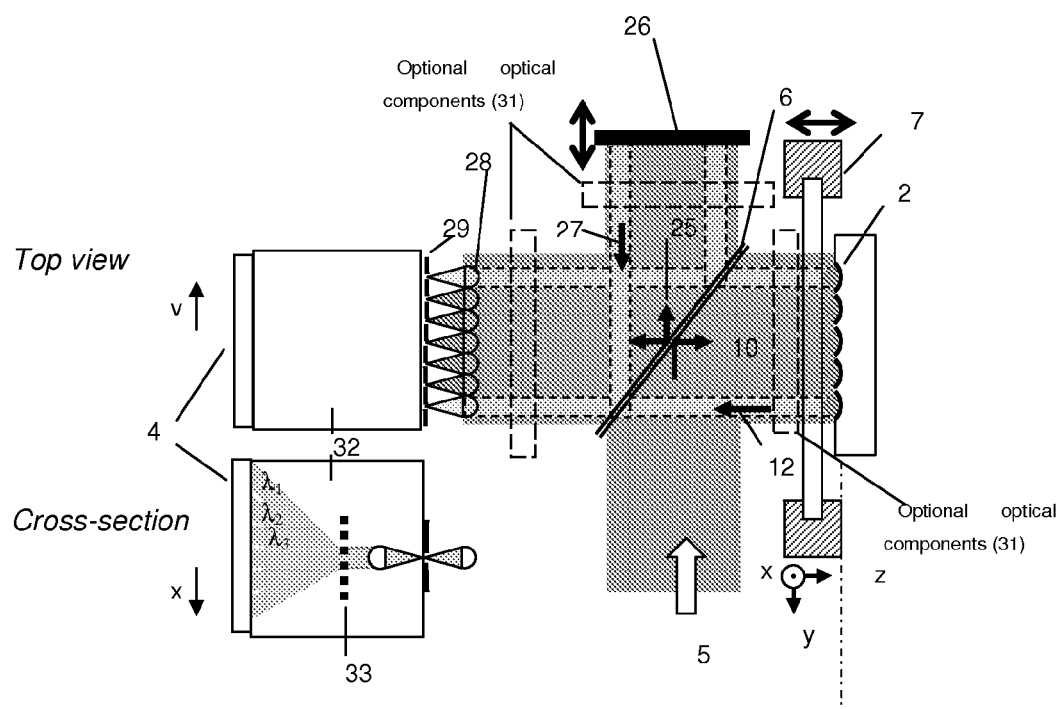
FIG. 13 depicts a schematic diagram of a Fourier-domain OCT based on a broadband light source and a dispersive element.

The use of dispersive elements for recording the spectral profiles is particularly useful if the micro-mirrors are aligned along a line. A schematic diagram of a Fourier-domain OCT based on a broadband light source and a dispersive element is depicted in FIG. 13. The images generated by the micro-lenses (28) are aligned along the entrance slit of a grating spectrograph (32). A two-dimensional detector array (4) at the exit of the spectrograph encodes, e.g., in its lines in transversal (x-) direction the position of the images from the micro-mirrors and in its columns (y-direction) the spectral components of the light collected by the micro-mirrors and generated by a transmission grating (33). The depth-profiles within the focal zone of the micro-mirrors are then obtained by FFT of the columns without scanning of either the objects or the micro-mirrors. As in the case of time domain OCTs, scanning might be used for extending the limited measurement range for high NA micro-mirrors. A phase modulation generated by an optional optical element such as, e.g., an electro-optic modulator, placed in the reference or the object arm allows introducing a $\pi$-phase shift in the interfering light. The acquisition and processing of two spectrograms with a phase shift of $\pi$ allows retrieving the complex spectral signal and reconstruction of the reflectivity profile over twice the depth of imaging suppressing one of the mirror images [32].

Figure 14:
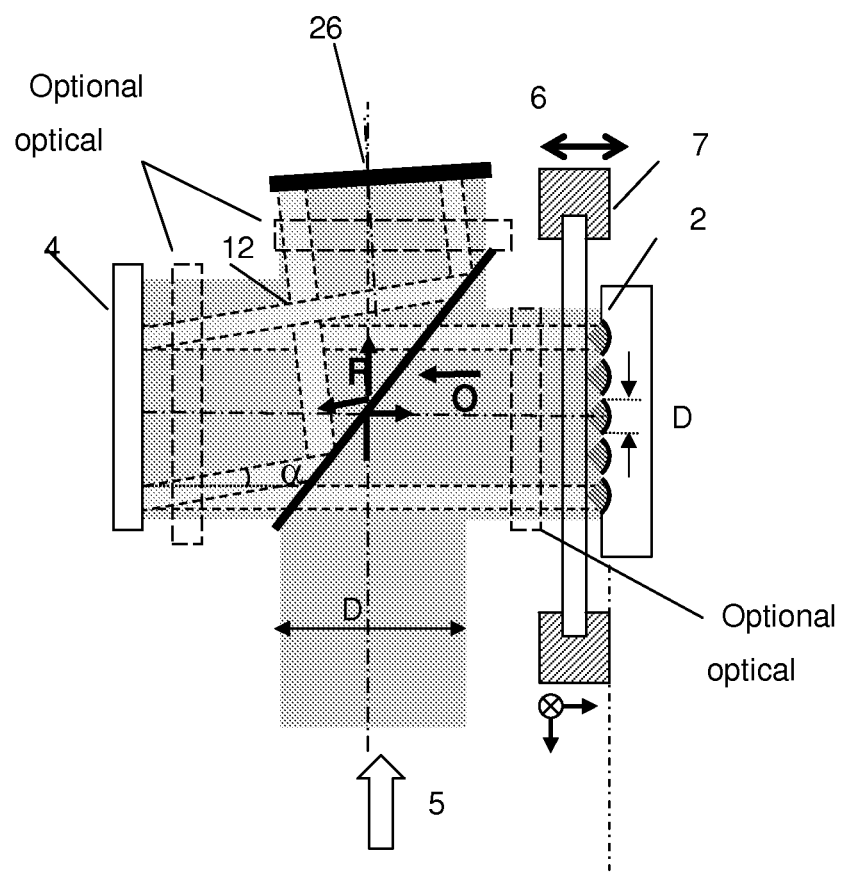
FIG. 14 shows a schematic arrangement for the generation of numeric off-axis holograms with micromirrors.

Digital Holographic Microscopy:

Interference fringes are generated in the detector plane if the reference mirror is slightly tilted by an angle of $\alpha/2$ with respect to the beam axis. Such a configuration is shown in FIG. 14. Beamlets from the object via micromirror (12) and from the reference mirror (26) intersect at an angle $\alpha$ at the detector plane and form interference fringes, if the difference of the optical path lengths between the object wave and the reference wave is smaller than the coherence length of the light source. For plane waves, e.g., the period of these fringes is given by:

$$\Lambda = \lambda/[2*\cos(\alpha)*\sin(\alpha/2)] \leq \lambda/\alpha \qquad \text{eq. 1}$$

where the approximation holds for small angles $\alpha$. For recording these interference fringes digitally with a detector array, the Nyquist theorem requires that the spacing s between adjacent detector elements has to be smaller than half the fringe period $\Lambda$. This imposes an upper limit for the interference angle $\alpha$ for a given spacing s of the detector elements:

$$\alpha < \alpha_{max} = \lambda/(2*s) \qquad \text{eq. 2}$$

Figure 15:
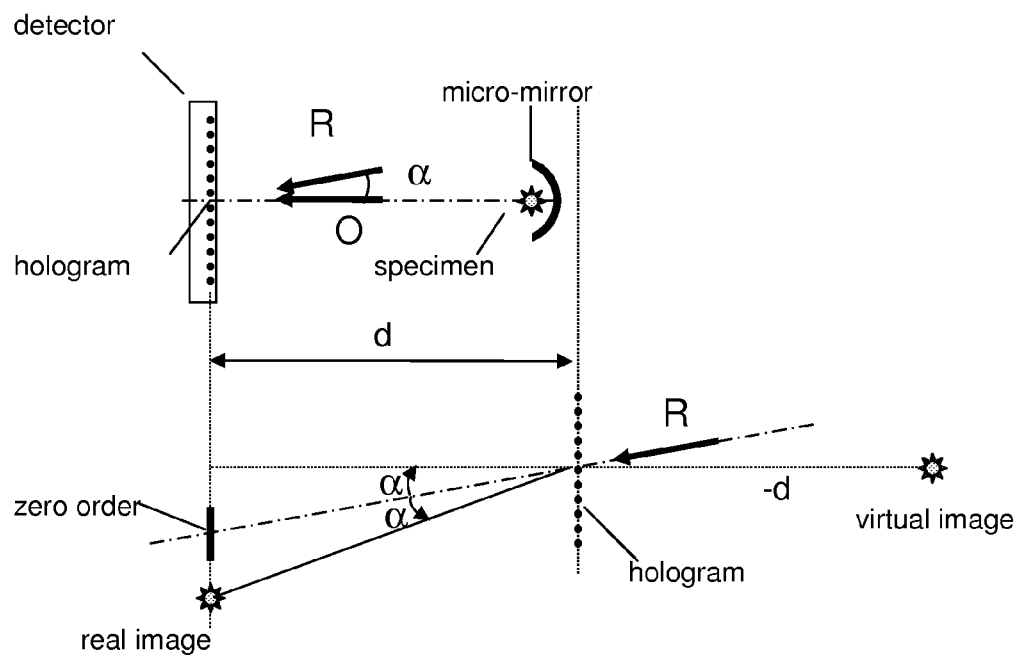
FIG. 15 shows the principle of image reconstruction from a hologram for one micro-mirror.

The interference fringes contain the information on the image from the object point in the specimen under investigation. The image reconstruction for one micro-mirror is schematically shown in FIG. 15. The upper part shows the recording of the hologram. For simplicity, the beamsplitter and the reference mirror are not shown. The distance d corresponds to the optical path length form the specimen via micro-mirror to the light sensitive plane of the detector array marked hologram. With a photographic plate containing the recorded hologram, a real and a virtual image of the object could be generated by irradiating the hologram with the reference wave R impinging under angle $\alpha$ on the hologram plane. The wave will be diffracted in transmission and reflection and the diffracted beams are at the origin of the two images formed at distances d in front and behind of the hologram. The non-diffracted beam is at the origin of the zero order light distribution. If a detector array is used instead of the photographic plate, the information on the interference pattern is only available in numerical (digital) form. A method has been developed that allows simultaneous amplitude and quantitative phase contrast retrieval for the images by numerical reconstruction [33]. In this technique, termed digital holography, the diffraction process is simulated numerically using the intensity distribution measured with the detector array and describing the diffracted light propagation using Fresnel transforms. This procedure allows using numerical filters for excluding the zero order light [34]. The extension of the zero order zone $\alpha_0$ should not overlap with the zones of the real or virtual image. This imposes a lower limit for the diffraction angle $\alpha$. For plane wave illumination, the extension of the zero order zone is given by the diffraction at the micro-mirrors and amounts to $\alpha_0 = 1.22*\lambda/D_{mm}$. The interference angle is chosen between:

$$\alpha_0 = 1.22*\lambda/D_{mm} < \alpha < \alpha_{max} = \lambda/(2*s) \qquad \text{eq. 13}$$

For the diffraction limited case, illumination at the foci of the micro-mirrors is essentially limited to Airy disks, i.e. each micro-mirror generates point images and depth profiles can be generated by translating the specimen or the reference mirror the same way as in a time domain OCT. The interference (AC-) term is separated from the zero order (DC-) term by the difference in spatial frequency.

A slightly diverging input wave, e.g. a spherical wave with the center of curvature at a distance L from micro-mirrors, can be used as input wave (5). A digital phase mask is then used in the Fresnel transform reconstruction process for compensating the wavefront curvature [35]. The radius of the illuminated zone in the focal plane of the micro-mirrors increases from $r_i=f^*\alpha_0$ to $r_i=f^*D_{mm}/(2^*L)$. The angle for the zero order zone increases to $\alpha_0'=r_i/f=D_{mm}/(2^*L)$. The limit for $\alpha_0'$ given by eq. 7 imposes a lower limit for the distance L of the center of curvature:

$$L \geq D_{mm}^{*}s/\lambda$$

Under diffraction limited conditions an image can be generated with an approximate number of pixels given by:

$$N \approx (\alpha_{max}/\alpha_0)^2 = (D_{mm}/(2.44^*s))^2$$

For micro-mirrors with a diameter of 245 µm and a detector array with a pitch of s=3 µm, the number of pixels that can be reconstructed per micro-mirror amounts to N≈1100. For such an arrangement, diffraction limited conditions can only be achieved for object points on the symmetry axes of the micromirrors. Off axes points suffer from aberrations. They can be taken into account in the numerical reconstruction process [36].

The technique of numerical hologram reconstruction has evolved rapidly and the basic arrangement shown in FIG. 14 can be modified by optics experts. The Michelson interferometer could be replaced by, e.g., the Mach Zehnder or other two beam interferometers for generating a coherent off-axis illumination. Optional optical components, lenses, polarizers, beamsplitters, spatial filters etc., can be inserted for realizing polarization imaging [37], birefringence-[38], refractive index-[39], or multi-wavelength-measurements [40].

Parallel Two-Photon Polymerization with Ultra-Short Pulsed Lasers

Micromirror arrays are not limited to imaging applications. Another example where the achromaticity, high numerical aperture and parallel arrangement of micromirror arrays may be exploited is three-dimensional nano-machining and photolithography techniques based on two-photon polymerization with ultra-short pulsed lasers [41-43].

When focused into the volume of a dedicated photosensitive material, ultra-short laser pulses initiate two-photon polymerization via two-photon absorption. Thanks to the non-linear nature of the process, only photosensitive material located within the focal area is polymerized, with a resolution that can go well beyond the diffraction limit. As a consequence, resolutions higher than with conventional UV lithography may be achieved.

High-NA focusing is necessary for achieving a small laser spot size and hence high transverse and axial resolutions. However, the high-NA alone is not sufficient. An intrinsic characteristic of ultra-short laser pulses (down to femtoseconds) is their extended spectral bandwidth $\lambda\Delta$, as the latter is inversely proportional to the pulse duration $\Delta t$, following the relationship $$\Delta\lambda = \frac{\alpha\lambda^2}{c\Delta t}$$

where $\alpha$ is a non-dimensional constant depending on the pulse shape, in the order of 0.3, and c is the speed of light. Practically speaking, a pulse duration of 5 fs, that could currently be achieved, e.g., with a mode-locked Ti:sapphire laser operating at a central wavelength 800 nm, implies a bandwidth exceeding 100 nm. This means that focusing ultrashort laser pulses to the diffraction-limit can only be achieved with achromatic optics.

Currently techniques for micromachining based on two-photon polymerization necessarily employ high-NA microscope objectives corrected for chromatic aberrations that allow tight diffraction-limited focusing of the ultra-short laser pulses. In order to fabricate two- or three dimensional structures, scanning techniques either based on stage-scanning or beam-scanning are employed, similarly as in confocal microscopy. Thus the same limitations that have been described for confocal microscopy apply to state of the art of two-photon polymerization techniques, severely restricting the throughput of micromachining based two-photon polymerization.

Micromirrors disclosed in the present invention offer all requirements for diffraction limited high-NA achromatic focusing of ultra-short laser pulses. The advantages offered by micromirrors over current techniques are the array format, potentially enabling parallel two-photon polymerization micromachining, and the wide-field operation.

Figure 16:
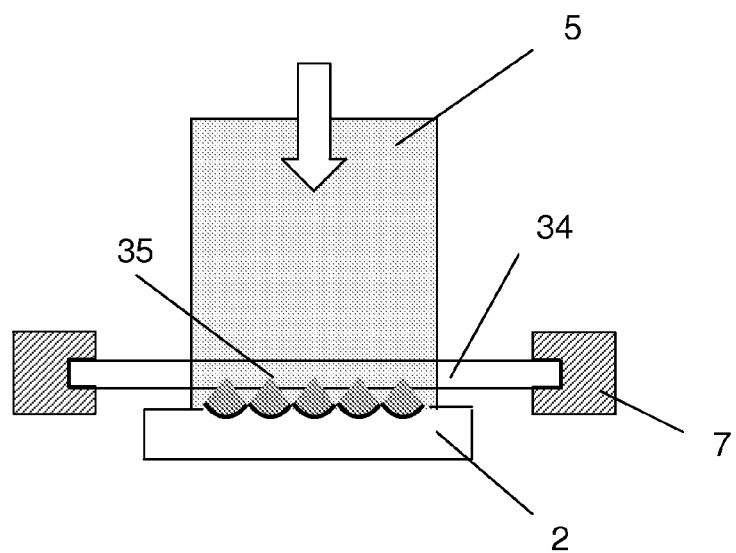
FIG. 16 shows a simple configuration for scanning a sample of photosensitive material with ultra-short pulsed laser as a light source.

In the simplest configuration shown in FIG. 16, when using an ultra-short pulsed laser as a light source 5, the array format may be exploited for simultaneously fabricating several identical two- or three-dimensional structures, by scanning a sample of photosensitive material 34 in the focal area 35 of the micromirror array 2 using a translational stage 7 (similarly as described in the section "Scanning with multiple focusing elements for large field imaging"). Structures as large as the pitch between micromirrors may be fabricated in this manner.

Figure 17:
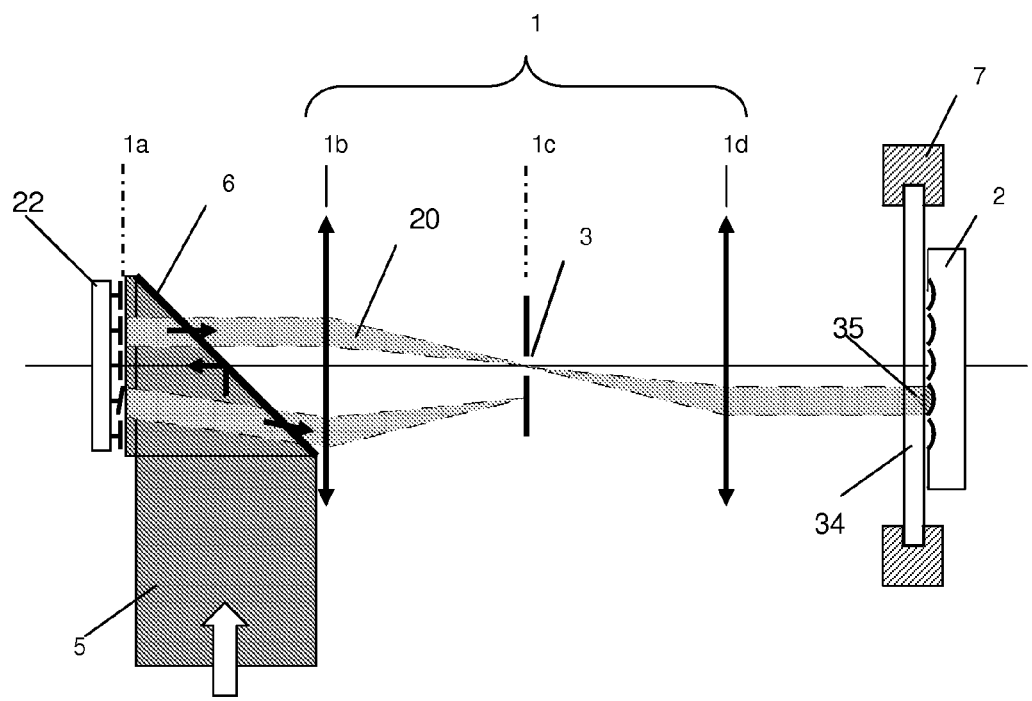
FIG. 17 shows a configuration for addressable photopolymerisation

Alternatively, as illustrated in FIG. 17, a spatial light modulator device 22 (such as a digital micromirror device) may be used to temporarily direct the pulsed laser light onto specified focusing micromirrors. The illumination 5 is made incident onto the spatial modulator device 22, e.g. by reflection on a beam-splitter 6 used for merging the illumination into the light path. Depending on the state of the individual elements of the spatial light modulator 22, the light beamlets 20 can be passed through the projection aperture (pinhole) 3 for illuminating the corresponding micromirror, or they can be stopped. Meanwhile, the sample of photosensitive material 34 is scanned with the translational stage 7. By synchronizing the spatial modulator device with the scanning stage, each micromirror would fabricate a different structure, thus allowing to arbitrarily pattern photosensitive material on a wide-area covered by the whole micromirror array, in a mosaic-like manner. As in the previous examples, transverse stage-scanning amplitudes as small as the pitch of the micromirror array are sufficient. This scheme may be used for maskless wide-area high-resolution photolithography, e.g. for the fabrication of microelectronic components.

Proof of Principle:

Confocal Fluorescence Microscope Based on Micromirror Arrays

A setup similar to the one illustrated on FIG. 3, including a focusing micromirrors array with hexagonal pattern has been used to produce a confocal fluorescence image of a slice of a fluorescently labelled convollaria root with a 633 nm excitation laser. The parabolic-shaped micromirrors with a cross-sectional diameter of 240 µm and a radius of curvature of 350 µm are operating in the air, providing a numerical aperture NA=0.6.

FIG. 18*a* shows a transmission image of the specimen with the micromirrors array on the background. The array pitch is 250 microns for a total area of 5×5 mm². The specimen of an approximate 3 mm diameter is thus entirely covered by the field of view of the instrument.

FIG. 18*b* is the confocal image in fluorescence of the specimen. The specimen has been scanned over a 250×250 microns area with a 2 microns resolution step leading to the acquisition of a total image within an approximated 5×5 mm² field of view. FIG. 18b shows a part of this total image restricted to the specimen of interest area. The image presented is thus composed of about 12×12 cells corresponding to individual confocal image simultaneously recorded for each micromirror.

Figure 19:
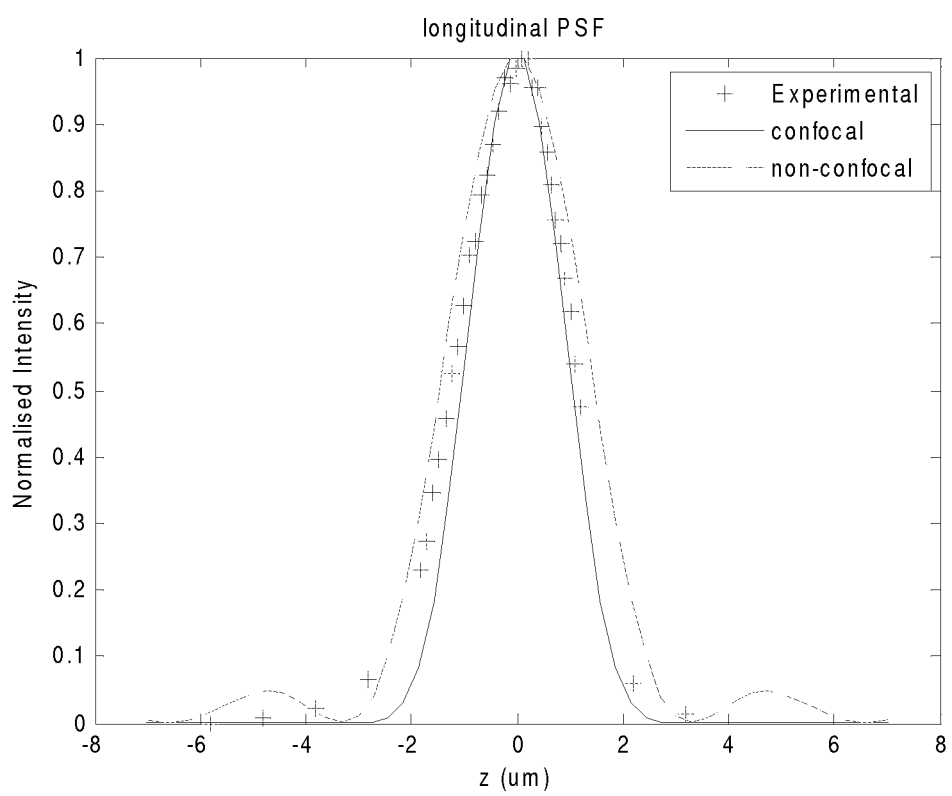
FIG. 19 compares an example of experimental PSF to the theoretical confocal and non-confocal case, for a NA=0.6 micromirror.

FIG. 19 compares an example of experimental PSF to the theoretical confocal and non-confocal case, for a NA=0.6 micromirror. A 100 nm diameter fluorescent nanobead has been axially scanned with a micromirror operating in the air, in a forward scanning configuration. The aperture stop used for confocal detection has a radius equivalent to the Airy radius expected at the Fourier plane due to the diffraction of the micromirror aperture. The fluorescent dye is excited at 633 nm and the fluorescence is detected for wavelengths above 660 nm. The sharpness of the measured central peak is comprised between diffraction limited response for a non-confocal scan and the response for a confocal scan in the ideal case of an infinitely small aperture stop. The effect of the spatial filtering is particularly visible with the side lobes cut off.

BIBLIOGRAPHY

1. Minsky, M., *Microscopy Apparatus*. 1957.
2. Johnson, K. C., *Microlens scanner for semiconductor mfr. microlithography, microscopy, document scanning and optical reading—uses low resolution image projection system with small numerical aperture but large image field with microlens array*, JOHNSON K C (JOHN-Individual). p. 991959-A2:.
3. Menon, R., D. Gil, and H. I. Smith, *Experimental characterization of focusing by high-numerical-aperture zone plates*. J. Opt. Soc. Am. A, 2006. 23(3): p. 567-571.
4. Ishihara, M., *Two dimensional array type cofocal optical system—has image formation part which forms image on 2D photo electric sensor*. 1998, Takaoka Elec Mfg Co Ltd (Taja) Takaoka Electric Mfg Co Ltd (Taja).
5. Ishihara, M. and H. Sasaki, *High-speed surface measurement using a nonscanning multiple-beam confocal microscope*. Optical Engineering, 1999. 38(6): p. 1035-1040.
6. Krantz, M. C., *Optical system for scanning optical microscopes, has array detector to collect light from object in parallel detection channels for each light spot and construct image of particular field of object*. 2001, KLA TENCOR CORP (KLAT-Non-standard).
7. Hell, S. and R. Pick, *Confocal microscope, e.g. a raster fluorescence microscope, comprises dual micro-lens arrays and a hole shutter array with a illumination light passing through only the first lens array, while reflected light passes through both*. 2003, MAX PLANCK GES FOERDERUNG WISSENSCHAFTEN (PLAC) HELL S (HELL-Individual) PICK R (PICK-Individual).
8. Fujita, K., et al., *Confocal multipoint multiphoton excitation microscope with microlens and pinhole arrays*. Optics Communications, 2000. 174(1-4): p. 7-12.
9. Drechsler, A., et al., *Confocal microscopy with a high numerical aperture parabolic mirror*. Opt. Express, 2001. 9(12): p. 637-644.
10. Wilson, T., *Confocal Microscopy*. 1990, London: Academic Press.
11. Cox, G., and Sheppard, C. J. R, *Effects of image deconvolution on optical sectioning in conventional and confocal microscopes*. Bioimaging, 1993. 1(2): p. 82.
12. Hell, S., Reiner, G., Cremer, C., Stelzer, E. H. K., *Aberrations in confocal fluorescence microscopy induced by mismatches in refractive index*. Journal of microscopy, 1993.
13. Ruckstuhl, T. and S. Seeger, *Confocal Total-Internal-Reflection Fluorescence Microscopy with a High-Aperture Parabolic Mirror Lens*. Appl. Opt., 2003. 42(16): p. 3277-3283.
14. Danielson, B. L. and C. D. Whittenberg, *Guided-wave reflectometry with micrometer precision*. Appl. Opt., 1987. 26: p. 2836-42.
15. Beaurepaire, E., et al., *Full field optical coherence microscopy*. Optics Lett., 1998. 23(4): p. 244-46.
16. Bourquin, S., Monterosso P., Seitz P., Salathé R. P., *Video rate optical low-coherence reflectometry based on a linear smart detector array*. Opt. Lett., 2000. 25(1): p. 102-04.
17. Lee, K. S. and L. P. Rolland, *Bessel beam spectral-domain high-resolution optical coherence tomography with microoptic axicon providing extended focusing range*. Optics Letters, 2008. 33(15): p. 1696-1698.
18. Podoleanu, A. G., J. A. Rogers, and D. A. Jackson, *Dynamic focus applied for correct determination of flow speed of a biological liquid using OCT*. Ofs-13: 13th International Conference on Optical Fiber Sensors & Workshop on Device and System Technology toward Future Optical Fiber Communication and Sensing, 1999. 3746: p. 288-291.
19. Lexer, F., et al., *Dynamic coherent focus OCT with depth-independent transversal resolution*. Journal of Modern Optics, 1999. 46(3): p. 541-553.
20. Schmitt, J. M., *Optical coherence tomography (OCT): A review*. Ieee Journal of Selected Topics in Quantum Electronics, 1999. 5(4): p. 1205-1215.
21. Hitzenberger, C. K., et al., *Measurement and imaging of birefringence and optic axis orientation by phase resolved polarization sensitive optical coherence tomography*. Optics Express, 2001. 9(13).
22. Schmitt, J. M., S. H. Xiang, and K. M. Yung, *Differential absorption imaging with optical coherence tomography*. Journal of the Optical Society of America a-Optics Image Science and Vision, 1998. 15(9): p. 2288-2296.
23. Izatt, J. A., et al., *In vivo bidirectional color Doppler flow imaging of picoliter blood volumes using optical coherence tomograghy*. Optics Letters, 1997. 22(18): p. 1439-1441.
24. Rollins, A. M. and J. A. Izatt, *Optimal interferometer designs for optical coherence tomography*. Optics Letters, 1999. 24(21): p. 1484-1486.
25. Karamata, B., et al., *Multiple scattering in optical coherence tomography. II. Experimental and theoretical investigation of cross talk in wide field optical coherence tomography*. Journal of the Optical Society of America a-Optics Image Science and Vision, 2005. 22(7): p. 1380-1388.
26. Bhushan, B., J. C. Wyant, and C. L. Koliopoulos, *Measurement of surface topography of magnetic tapes by Mirau interferometry*. Applied Optics, 1985. 24(10): p. 1489-97.
27. Creath, K., *Phase-measurement interferometry techniques, in Progress in optics. Vol. XXVI*. 1988, North-Holland: Amsterdam, Netherlands. p. 349-93.
28. Ghiglia, D. C. and M. D. pritt, *Two-Dimensional Phase Unwrapping, Theory, Algorithms, and software*. 1998, New York: Wiley-Interscience.
29. Wyant, J. C., *Use of an AC heterodyne lateral shear interferometer with real-time wavefront correction systems [for telescope]*. Applied Optics, 1975. 14(11): p. 2622-6.
30. Yun, S. H., et al., *High-speed optical frequency-domain imaging*. Optics Express, 2003. 11(22).
31. Leitgeb, R., et al., *Spectral measurement of absorption by spectroscopic frequency-domain optical coherence tomography*. Optics Letters, 2000. 25(11): p. 820-2.

32. Leitgeb, R., C. K. Hitzenberger, and A. F. Fercher, *Performance of Fourier domain vs. time domain optical coherence tomography*. Optics Express, 2003. 11(8).
33. Cuche, E. and C. Depeursinge, *Method for simultaneous amplitude and quantitative phase contrast imaging by adjusting reconstruction parameters for definition of digital replica of reference wave and aberration parameters correction digitally*, ECOLE POLYTECHNIQUE FEDERALE LAUSANNE (ECOL-Non-standard) INST APPLIED OPTICS SWISS FEDERAL INST (OPTI-Non-standard) EPFL ECOLE POLYTECHNIQUE FEDERALE LAUSAN (EPFL-Non-standard).
34. Cuche, E., P. Marquet, and C. Depeursinge, *Spatial filtering for zero-order and twin-image elimination in digital off-axis holography*. Applied Optics, 2000. 39(23): p. 4070-4075.
35. Cuche, E., P. Marquet, and C. Depeursinge, *Simultaneous amplitude-contrast and quantitative phase-contrast microscopy by numerical reconstruction of Fresnel off-axis holograms*. Applied Optics, 1999. 38(34): p. 6994-7001.
36. Colomb, T., et al., *Numerical parametric lens for shifting, magnification, and complete aberration compensation in digital holographic microscopy*. Journal of the Optical Society of America a-Optics Image Science and Vision, 2006. 23(12): p. 3177-3190.
37. Colomb, T., et al., *Polarization imaging by use of digital holography*. Applied Optics, 2002. 41(1): p. 27-37.
38. Colomb, T., et al., *Polarization microscopy by use of digital holography: application to optical-fiber birefringence measurements*. Applied Optics, 2005. 44(21): p. 4461-4469.
39. Apostolopoulos, V., et al., *Femtosecond-irradiation-induced refractive-index changes and channel waveguiding in bulk Ti3+: Sapphire*. Applied Physics Letters, 2004. 85(7): p. 1122-1124.
40. Montfort, F., et al., *Submicrometer optical tomography by multiple-wavelength digital holographic microscopy*. Applied Optics, 2006. 45(32): p. 8209-8217.
41. Denk, W., J. H. Strickler, and W. W. Webb, *2-Photon Laser Scanning Fluorescence Microscopy*. Science, 1990. 248(4951): p. 73-76.
42. Maruo, S., O. Nakamura, and S. Kawata, *Three-dimensional microfabrication with two-photon-absorbed photopolymerization*. Optics Letters, 1997. 22(2): p. 132-134.
43. Yablonovitch, E. and R. B. Vrijen, *Optical projection lithography at half the Rayleigh resolution limit by two-photon exposure*. Optical Engineering, 1999. 38(2): p. 334-338.

The invention claimed is:

1. A high-resolution microscopy device comprising a light source, a sample area, a plurality of focusing micromirrors, and a plurality of detector elements, wherein said sample area is located in the focus area of said micromirrors, wherein each focusing micromirror is adapted to collect and direct a sample information towards said detector elements, and further comprising one or a plurality of aperture stops for filtering out collected sample information that is not originating from foci of the micromirrors for confocal detection to form a scanned confocal image, and also comprising a three-directional translation mechanism that is adapted for establishing a relative motion between said sample and said micromirrors to record, using the plurality of detector position of the micromirrors relative to the sample to produce the scanned confocal image of the sample.

2. The high-resolution microscopy device according to claim 1 wherein said micromirrors have a numerical aperture which is greater than 0.6.

3. The high-resolution microscopy device according to claim 1 wherein each micromirror is adapted to focus an illumination light towards a sample.

4. The high-resolution microscopy device according to claim 1 comprising a beam splitter for dividing an illuminating light into two parts, one part being directed to said micromirrors for illuminating a sample and being then sent to said detector elements, the other part being used as reference beam for illuminating said detector elements, this configuration being furthermore adapted in a way that both parts interfere at the detector elements.

5. The high-resolution microscopy device according to claim 4 comprising phase changing means for changing the optical phase between said two parts.

6. The high-resolution microscopy device according to claim 4 wherein the optical axes of said two parts in front of the detector elements form an angle, the detector elements being arranged in a way that they can measure the interference fringes.

7. A method of detecting fluorescent molecules using a high-resolution microscopy device comprising:
providing a light source, a sample area, a plurality of focusing micromirrors, and a plurality of detector elements, wherein said sample area is located in the focus area of said micromirrors,
utilizing each focusing micromirror to collect and direct sample information towards said detector elements, for the detection of fluorescent molecules,
providing one or a plurality of aperture stops for filtering out collected sample information that is not originating from foci of the micromirrors for confocal detection to form a scanned confocal image,
providing a three-directional translation mechanism which establishes a relative motion between said sample and said micromirrors to
and recording using the plurality of detector elements, different sample information across the sample with changing position of the micromirrors relative to the sample to produce the scanned confocal image of the sample.

8. The method of claim 7 further comprising conducting Stimulated Emission Depletion microscopy.

9. A method for conducting topography measurements using a high-resolution microscopy device comprising:
providing a light source, a sample area, a plurality of focusing micromirrors, and a plurality of detector elements, wherein said sample area is located in the focus area of said micromirrors,
utilizing each focusing micromirror to collect and direct sample information towards said detector elements, for topography measurements,
providing one or a plurality of aperture stops for filtering out collected sample information that is not originating from foci of the micromirrors for confocal detection to form a scanned confocal image,
providing a three-directional translation mechanism which establishes a relative motion between said sample and said micromirrors
and recording using the plurality of detector elements, different sample information across the sample with changing position of the micromirrors relative to the sample to produce the scanned confocal image of the sample.

10. A method for conducting measurements on LCD panels using a high-resolution microscopy device comprising:

providing a light source, a sample area, a plurality of focusing micromirrors, and a plurality of detector elements, wherein said sample area is located in the focus area of said micromirrors, utilizing each focusing micromirror to collect and direct sample information towards said detector elements, for measurements on LCD panels, providing one or a plurality of aperture stops for filtering out collected sample information that is not originating from foci of the micromirrors for confocal detection to form a scanned confocal image, providing a three-directional translation mechanism which establishes a relative motion between said sample and said micromirrors to and recording using the plurality of detector elements, different sample information across the sample with changing position of the micromirrors relative to the sample to produce the scanned confocal image of the sample.

11. A method for conducting measurements on solar cells using a high-resolution microscopy device comprising:

providing a light source, a sample area, a plurality of focusing micromirrors, and a plurality of detector elements, wherein said sample area is located in the focus area of said micromirrors, utilizing each focusing micromirror to collect and direct sample information towards said detector elements, for measurements on solar cells, providing one or a plurality of aperture stops for filtering out collected sample information that is not originating from foci of the micromirrors for confocal detection to form a scanned confocal image, providing a three-directional translation mechanism which establishes a relative motion between said sample and said micromirrors to and recording using the plurality of detector elements, different sample information across the sample with changing position of the micromirrors relative to the sample to produce the scanned confocal image of the sample.

12. A method for conducting Optical Coherence Microscopy (OCM) using a high-resolution microscopy device comprising:

providing a light source, a sample area, a plurality of focusing micromirrors, and a plurality of detector elements, wherein said sample area is located in the focus area of said micromirrors, utilizing each focusing micromirror to collect and direct sample information towards said detector elements, for Optical Coherence Microscopy (OCM), providing one or a plurality of aperture stops for filtering out collected sample information that is not originating from foci of the micromirrors for confocal detection to form a scanned confocal image, providing a three-directional translation mechanism which establishes a relative motion between said sample and said micromirrors to and recording using the plurality of detector elements, different sample information across the sample with changing position of the micromirrors relative to the sample to produce the scanned confocal image of the sample.

13. A method for conducting Optical Coherence Tomography (OCT) using a high-resolution microscopy device comprising:

providing a light source, a sample area, a plurality of focusing micromirrors, and a plurality of detector elements, wherein said sample area is located in the focus area of said micromirrors, utilizing each focusing micromirror to collect and direct sample information towards said detector elements, for Optical Coherence Tomography (OCT), providing one or a plurality of aperture stops for filtering out collected sample information that is not originating from foci of the micromirrors for confocal detection to form a scanned confocal image, and also comprising providing a three-directional translation mechanism which establishes a relative motion between said sample and said micromirrors and recording using the plurality of detector elements, different sample information across the sample with changing position of the micromirrors relative to the sample to produce the scanned confocal image of the sample.

14. A method for conducting Digital Holography Microscopy (DHM) using a high-resolution microscopy device comprising:

providing a light source, a sample area, a plurality of focusing micromirrors, and a plurality of detector elements, wherein said sample area is located in the focus area of said micromirrors, utilizing each focusing micromirror to collect and direct sample information towards said detector elements, for Digital Holography Microscopy (DHM), providing one or a plurality of aperture stops for filtering out collected sample information that is not originating from foci of the micromirrors for confocal detection to form a scanned confocal image, providing a three-directional translation mechanism which establishes a relative motion between said sample and said micromirrors to and recording using the plurality of detector elements, different sample information across the sample with changing position of the micromirrors relative to the sample to produce the scanned confocal image of the sample.

* * * * *